(12) United States Patent
Taoka et al.

(10) Patent No.: US 11,317,068 B2
(45) Date of Patent: Apr. 26, 2022

(54) SIGNAL PROCESSING APPARATUSES AND SIGNAL PROCESSING METHODS

(71) Applicant: Samsung Electronics Co., Ltd., Suwon-si (KR)

(72) Inventors: Mineki Taoka, Yokohama (JP); Takashi Okazaki, Yokohama (JP); Chul Joon Heo, Busan (KR); Gae Hwang Lee, Seongnam-si (KR); Kyung Bae Park, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 16/675,698

(22) Filed: Nov. 6, 2019

(65) Prior Publication Data

US 2020/0145631 A1    May 7, 2020

(30) Foreign Application Priority Data

Nov. 7, 2018  (JP) .............................. JP2018-209811
Jul. 25, 2019  (JP) .............................. JP2019-136724

(51) Int. Cl.
*H04N 9/64* (2006.01)
*H04N 9/04* (2006.01)
(Continued)

(52) U.S. Cl.
CPC ............. *H04N 9/646* (2013.01); *H04N 5/379* (2018.08); *H04N 9/0451* (2018.08);
(Continued)

(58) Field of Classification Search
CPC .. H04N 9/646; H04N 9/0451; H04N 9/04557; H04N 9/04515; H04N 5/379;
(Continued)

(56) References Cited

U.S. PATENT DOCUMENTS 7,667,750 B2   2/2010  Goto et al.
8,120,690 B2 *  2/2012  Utagawa ............ H04N 9/04557
                                                          348/315
(Continued)

FOREIGN PATENT DOCUMENTS

JP    2006210497 A    8/2006
JP    4700947 B2      6/2011
(Continued)

*Primary Examiner* — Shahbaz Nazrul
(74) *Attorney, Agent, or Firm* — Harness, Dickey & Pierce, P.L.C.

(57) ABSTRACT

In a signal processing apparatus, a photoelectric conversion member includes a first photoelectric conversion layer configured to photoelectrically convert at least one of blue light or red light, and a second photoelectric conversion layer on an incident light surface of the first photoelectric conversion layer and configured to photoelectrically convert green light. An interpolation circuit is configured to interpolate at least one of a blue light signal or a red light signal obtained by photoelectric conversion in the first photoelectric conversion layer L1, using a green light signal obtained by photoelectric conversion in the second photoelectric conversion layer L2. An absorption correction circuit is configured to perform absorption correction on the green light signal, using at least one of the blue light signal or the red light signal that are interpolated by the interpolation circuit.

18 Claims, 18 Drawing Sheets

(51) Int. Cl.
   *H04N 5/369*      (2011.01)
   *H01L 27/146*     (2006.01)
   *H01L 27/28*      (2006.01)
   *H01L 27/30*      (2006.01)

(52) U.S. Cl.
   CPC ...... *H01L 27/14647* (2013.01); *H01L 27/286* (2013.01); *H01L 27/307* (2013.01)

(58) Field of Classification Search
   CPC . H04N 9/045; H01L 27/14647; H01L 27/286; H01L 27/307; G06T 3/4015
   See application file for complete search history.

(56) References Cited

U.S. PATENT DOCUMENTS

| | | |
|---|---|---|
| 9,106,785 B2 | 8/2015 | Maeda |
| 9,287,302 B2 | 3/2016 | Egawa |
| 9,905,615 B2 | 2/2018 | Lee et al. |
| 2006/0266921 A1* | 11/2006 | Kang ............... H01L 27/14627 250/208.1 |
| 2014/0118579 A1 | 5/2014 | Kim et al. |
| 2018/0114926 A1* | 4/2018 | Ujiie ................... H01L 51/0058 |
| 2020/0099003 A1* | 3/2020 | Ujiie ..................... H01L 27/307 |

FOREIGN PATENT DOCUMENTS

| | | |
|---|---|---|
| JP | 4866656 B2 | 2/2012 |
| JP | 2015115345 A | 6/2015 |
| JP | 5787856 B2 | 9/2015 |
| JP | 2019092003 A | 6/2019 |

\* cited by examiner

Change B/R interpolation coefficient
according to gradient of G pixel value

SIGNAL PROCESSING APPARATUSES AND SIGNAL PROCESSING METHODS

CROSS-REFERENCE TO RELATED APPLICATION

This application claims priority to and the benefit of Japanese Patent Application No. 2018-209811 filed in the Japan Patent Office on Nov. 7, 2018 and Japanese Patent Application No. 2019-136724 filed in the Japan Patent Office on Jul. 25, 2019, the entire contents of each of which are incorporated herein by reference.

BACKGROUND

(a) Field

The described technology generally relates to signal processing apparatuses and signal processing methods.

(b) Description of the Related Art

Photoelectric conversion members, using silicon as a single material, for use in digital cameras have been developed. However, when the silicon is used as the single material in a photoelectric conversion member, a band gap associated with the photoelectric conversion member is fixed (e.g., constant) and a color filter is formed only on a surface of the photoelectric conversion member. Therefore, the photoelectric conversion member using the silicon as the single material should arrange red pixels, green pixels, and blue pixels in a surface direction to perform color imaging with a single plate.

In addition, when a higher-resolution subject is imaged by using the above-described photoelectric conversion member, luminance moiré or color moiré may occur. Therefore, it is necessary to mount an optical low-pass filter in the imaging apparatus in order to suppress the luminance moiré or color moiré. However, if the optical low-pass filter is mounted in the imaging apparatus, the resolution is lowered.

Japanese Patent No. 4700947 (hereinafter referred to as the "'947 patent") discloses a photoelectric conversion member in which a silicon film on which green pixels are arranged is stacked on a side in which incident light enters in a silicon film on which blue pixels and red pixels are arranged. In such a photoelectric conversion member, since pixels that absorb a green wavelength exist over the entire surface of the photoelectric conversion member, there is theoretically no luminance moiré, and color moiré may be significantly suppressed.

However, in the photoelectric conversion member described in '947 patent, the blue wavelength and the red wavelength may be partially absorbed by the pixels on the upper layer that absorb the green wavelength. As a result, the color reproducibility may be deteriorated, the noise resistance in the blue region may be deteriorated, and the color resolution may be also deteriorated. Therefore, U.S. Patent Application Publication No. 2014/118579 (hereinafter referred to as the "'579 application") disclosing that the green pixel signal is corrected (absorption correction) by using at least one of the blue pixel signal and the red pixel signal has been suggested.

However, in the photoelectric conversion member described in '579 application, since the blue pixels and the red pixels are arranged in the checkered pattern, the blue pixels or the red pixels exist over only half of the green pixels. Therefore, the green absorption correction is performed in the checkered pattern so that the color reproducibility and the color resolution may be deteriorated.

SUMMARY

Some example embodiments of the present inventive concepts provide signal processing apparatuses and a signal processing methods that provide excellent color reproducibility and color resolution.

Some example embodiments of the present inventive concepts provide a signal processing apparatus including a photoelectric conversion member, an interpolation circuit, and an absorption correction circuit. The photoelectric conversion member may include a first photoelectric conversion layer that is configured to photoelectrically convert first light and second light having a different wavelength from the first light, and a second photoelectric conversion layer on an incident light surface of the first photoelectric conversion layer and is configured to photoelectrically convert third light having a different wavelength from the first light and the second light. The interpolation circuit may be configured to interpolate at least one of a signal of the first light or a signal of the second light obtained by photoelectric conversion in the first photoelectric conversion layer, using a signal of third light obtained by photoelectric conversion in the second photoelectric conversion layer. The absorption correction circuit may be configured to perform absorption correction on the signal of the third light, using the interpolated at least one of the signal of the first light or the signal of the second light.

In the signal processing apparatus according to some example embodiments of the present inventive concepts, at least one of the signal of the first light or the signal of the second light may be interpolated by using the third light signal before the absorption correction on the signal of the third light is performed. Therefore, the absorption correction on the signal of the third light may be performed by using at least one of the interpolated signal of the first light and the interpolated signal of the second light. That is, it is possible to at least partially or entirely prevent the absorption correction on the signal of the third light from being performed in a checkered pattern. As a result, the signal processing apparatus may perform signal processing with excellent color reproducibility and color resolution.

The interpolation circuit may interpolate the at least one of the signal of the first light or the signal of the second light obtained by photoelectric conversion in the first photoelectric conversion layer, using intensity gradient information of the signal of the third light obtained by photoelectric conversion in the second photoelectric conversion layer.

Since the second photoelectric conversion layer may partially absorb at least one of the first light or the second light, the signal of the third light obtained by photoelectric conversion in the second photoelectric conversion layer may include at least one of a part of the first light component or a part of the second light component. Therefore, at least one of the signal of the first light or the signal of the second light obtained by the photoelectric conversion in the first photoelectric conversion layer may be interpolated by using the intensity gradient information of the third light signal obtained by the photoelectric conversion by the second photoelectric conversion layer so that the interpolation may be performed with higher accuracy.

The absorption correction unit may perform the absorption correction on the signal of the third light by subtracting a value obtained by multiplying a value of the signal of the first light by $\alpha/(1-\alpha)$ from the signal of the third light. Here, α is a correction value determined in consideration of at least one of a component of the first light or a component of the second light absorbed by the second photoelectric conversion layer.

The absorption correction on the signal of the third light may be performed by using the correction value α determined in consideration of at least one of the first light component or the second light component partially absorbed in the second photoelectric conversion layer so that the absorption correction may be performed with the higher accuracy.

Some example embodiments of the present inventive concepts provide a signal processing apparatus including a photoelectric conversion member, a first interpolation circuit, a first absorption correction circuit, and a second interpolation circuit. The photoelectric conversion member includes a first photoelectric conversion layer that is configured to photoelectrically convert first light and second light having a different wavelength from the first light, and a second photoelectric conversion layer that is provided on an incident light surface of the first photoelectric conversion layer and is configured to photoelectrically convert third light having a different wavelength from the first light and the second light. The first interpolation circuit may interpolate a signal of the first light obtained by photoelectric conversion in the first photoelectric conversion layer, using a signal of third light obtained by photoelectric conversion in the second photoelectric conversion layer. The first absorption correction circuit may perform absorption correction on the signal of the third light, using the interpolated signal of the first light. The second interpolation circuit may interpolate a signal of the second light obtained by photoelectric conversion in the first photoelectric conversion layer, using the absorption-corrected signal of third light.

In the signal processing apparatus according to some example embodiments of the present inventive concepts, the signal of the first light may be interpolated by using the signal of the third light before the absorption correction on the third light signal is performed. Therefore, the absorption correction on the signal of the third light may be performed by using the interpolated signal of the first light. As a result, the signal processing apparatus may perform signal processing with excellent color reproducibility and color resolution. Further, since the second photoelectric conversion layer may partially absorb the first light, the signal of the third light obtained by the photoelectric conversion in the second photoelectric conversion layer may include a part of the first light component. However, since the signal of the second light may be interpolated by using the absorption-corrected signal of the third light, the signal of the second light may be interpolated by removing the first light component included in the signal of the third light. As a result, the signal of the second light may be interpolated with the higher accuracy.

The first interpolation circuit may interpolate the signal of the first light obtained by photoelectric conversion in the first photoelectric conversion layer, using intensity gradient information of the signal of the third light obtained by photoelectric conversion in the second photoelectric conversion layer.

Since the second photoelectric conversion layer may partially absorb the first light, the signal of the third light obtained by photoelectric conversion in the second photoelectric conversion layer may include a part of the first light component. Therefore, the signal of the first light obtained by the photoelectric conversion in the first photoelectric conversion layer may be interpolated by using the intensity gradient information of the third light signal obtained by the photoelectric conversion by the second photoelectric conversion layer so that the interpolation may be performed with the higher accuracy.

The second interpolation unit may interpolate the signal of the second light obtained by photoelectric conversion in the first photoelectric conversion layer, using intensity gradient information of the absorption-corrected signal of third light.

Since the second photoelectric conversion layer may partially absorb the second light, the signal of the third light obtained by photoelectric conversion in the second photoelectric conversion layer includes a part of the second light component. Therefore, the signal of the second light obtained by the photoelectric conversion in the first photoelectric conversion layer may be interpolated by using the intensity gradient information of the third light signal obtained by the photoelectric conversion by the second photoelectric conversion layer so that the interpolation may be performed with the higher accuracy. Further, since the second photoelectric conversion layer may partially absorb the first light, the signal of the third light obtained by photoelectric conversion in the second photoelectric conversion layer may include a part of the first light component. However, since the signal of the second light may be interpolated by using the absorption-corrected signal of the third light, the signal of the second light may be interpolated by removing the first light component included in the signal of the third light. As a result, the signal of the second light may be interpolated with the higher accuracy.

The first absorption correction circuit may perform the absorption correction on the signal of the third light by subtracting a value obtained by multiplying a value of the signal of the first light by $\alpha/(1-\alpha)$ from the signal of the third light. Here, α is a correction value determined in consideration of a component of the first light absorbed by the second photoelectric conversion layer.

The absorption correction on the signal of the third light may be performed by using the correction value α determined in consideration of the first light component partially absorbed in the second photoelectric conversion layer so that the absorption correction may be performed with the higher accuracy.

The signal processing apparatus may further include a second absorption correction circuit that may perform absorption correction on the absorption-corrected signal of the third light using the interpolated signal of the second light.

The absorption correction on the signal of the third light may be performed by using the interpolated signal of the first light and also using the interpolated signal of the second light so that the signal of the third light with the higher color reproducibility may be generated.

The first photoelectric conversion layer may photoelectrically convert blue light as the first light and red light as the second light, and the second photoelectric conversion layer may photoelectrically convert green light as the third light.

As a result, the absorption correction on the signal of the green light may be performed by using the blue light that is easily absorbed by the second photoelectric conversion layer that absorbs the green light so that the signal processing with excellent color reproducibility and color resolution.

Some example embodiments of the present inventive concepts provide a method of processing a signal generated by a photoelectric conversion member. The photoelectric conversion member includes a first photoelectric conversion layer that is configured to photoelectrically convert first light and second light having a different wavelength from the first light, and a second photoelectric conversion layer on an incident light surface of the first photoelectric conversion layer and is configured to photoelectrically convert third light having a different wavelength from the first light and the second light. The method includes interpolating at least one of a signal of the first light or a signal of the second light obtained by photoelectric conversion in the first photoelectric conversion layer, using a signal of third light obtained by photoelectric conversion in the second photoelectric conversion layer, and performing absorption correction on the signal of the third light, using at least one of the interpolated signal of the first light and the interpolated signal of the second light.

In the signal processing method according to some example embodiments of the present inventive concepts, at least one of the signal of the first light or the signal of the second light may be interpolated by using the third light signal before the absorption correction on the signal of the third light is performed. Therefore, the absorption correction on the signal of the third light may be performed by using at least one of the interpolated signal of the first light or the interpolated signal of the second light. That is, it is possible to prevent the absorption correction on the signal of the third light from being performed in a checkered pattern. As a result, the signal processing method may perform signal processing with excellent color reproducibility and color resolution.

Some example embodiments of the present inventive concepts provide a method of processing a signal generated by a photoelectric conversion member. The photoelectric conversion member includes a first photoelectric conversion layer that is configured to photoelectrically convert first light and second light having a different wavelength from the first light, and a second photoelectric conversion layer that on an incident light surface of the first photoelectric conversion layer and is configured to photoelectrically convert third light having a different wavelength from the first light and the second light. The method may include interpolating a signal of the first light obtained by photoelectric conversion in the first photoelectric conversion layer, using a signal of third light obtained by photoelectric conversion in the second photoelectric conversion layer. The method may further include performing absorption correction on the signal of the third light, using the interpolated signal of the first light, and interpolating a signal of the second light obtained by photoelectric conversion in the first photoelectric conversion layer, using absorption-corrected the signal of third light.

In the signal processing method according to still some example embodiments of the present inventive concepts, the signal of the first light may be interpolated by using the signal of the third light before the absorption correction on the third light signal is performed. Therefore, the absorption correction on the signal of the third light may be performed by using the interpolated signal of the first light. As a result, the signal processing apparatus may perform signal processing with excellent color reproducibility and color resolution. Further, since the second photoelectric conversion layer may partially absorb the first light, the signal of the third light obtained by the photoelectric conversion in the second photoelectric conversion layer may include a part of the first light component. However, since the signal of the second light may be interpolated by using the absorption-corrected signal of the third light, the signal of the second light may be interpolated by removing the first light component included in the signal of the third light. As a result, the signal of the second light may be interpolated with the higher accuracy.

According to some example embodiments of the present inventive concepts, a signal processing apparatus and a signal processing method excellent in color reproducibility and color resolution may be provided.

DETAILED DESCRIPTION

Figure 1:
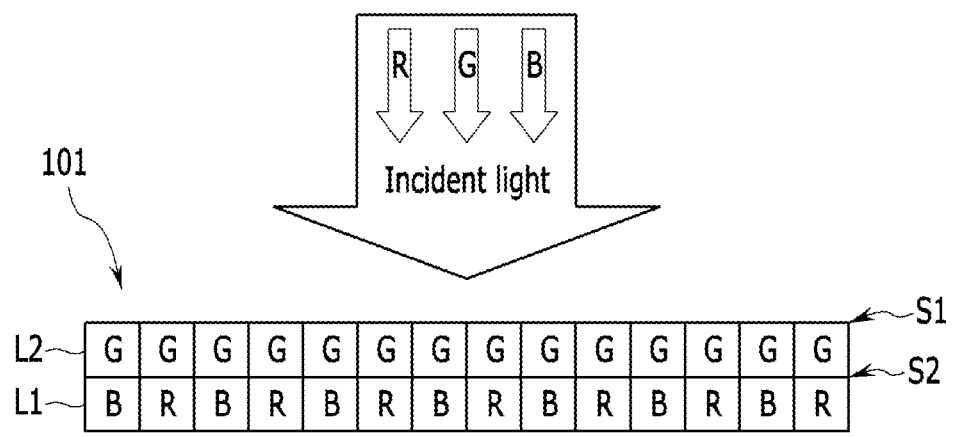
FIG. 1 is a schematic diagram showing an example of a photoelectric conversion member according to some example embodiments of the present inventive concepts.

In the following detailed description, only certain example embodiments of the present inventive concepts have been shown and described, simply by way of illustration. As those skilled in the art would realize, the described embodiments may be modified in various different ways, all without departing from the spirit or scope of the present inventive concepts. Accordingly, the drawings and description are to be regarded as illustrative in nature and not restrictive. Like reference numerals designate like elements throughout the specification.

Hereinafter, some example embodiments of the present inventive concepts are described with reference to the drawings. FIG. 1 is a schematic diagram showing an example of a photoelectric conversion member 101 according to some example embodiments of the present inventive concepts.

A signal processing apparatus is an apparatus that may process a signal generated based on capturing an image (e.g., "imaging") in an imaging apparatus including a digital camera, that is, a signal indicating a captured image. The signal processing apparatus may include an imaging unit of the imaging apparatus. The imaging unit may include an image sensor as a photoelectric conversion member 101 shown in FIG. 1. The imaging unit may further include an optical system lens. The optical system lens may form an image of light emitted from a subject on a light receiving surface (e.g., incident light surface) 51 of the photoelectric conversion member 101, and the photoelectric conversion member may photoelectrically convert the received light (e.g., incident light) to generate the signal (e.g., electrical signal) indicating the captured image. That is, the signal processing apparatus may be an imaging apparatus including the imaging unit that includes the photoelectric conversion member 101 and the optical system lens.

Examples of the signal generated by imaging in the imaging apparatus may include a red light signal, a green light signal, and a blue light signal. The examples of signal generated by imaging in the imaging apparatus may further include a signal obtained by photoelectric conversion of light having a near-infrared (NIR) wavelength, that is, a signal indicating an infrared image.

As shown in FIG. 1, the photoelectric conversion member 101 includes, for example, a first photoelectric conversion layer L1 and a second photoelectric conversion layer L2, and may generate a signal having blue light (B) as first light, a signal having red light (R) as second light, and a signal having green light (G) as third light by the photoelectric conversion. It will be understood that the first light, second light, and third light may have different wavelengths with respect to each other.

The first photoelectric conversion layer L1 is a photoelectric conversion layer that may be configured to photoelectrically convert the blue light (first light) and/or the red light (second light). The second photoelectric conversion layer L2 is a photoelectric conversion layer that may be configured to photoelectrically convert the green light (third light). In addition, the second photoelectric conversion layer L2 is provided on a side in which incident light enters compared with the first photoelectric conversion layer L1 (e.g., the incident light surface S2 of the first photoelectric conversion layer L1), such that the first photoelectric conversion layer L1 is configured to receive the first light (e.g., blue light) and the second light (e.g., red light) through the second photoelectric conversion layer L2. As shown in FIG. 1, the incident light may include blue light (B) as first light, red light (R) as second light, and green light (G) as third light. When a direction in which the incident light enters is defined as an "upward direction", the second photoelectric conversion layer L2 corresponds to an upper layer, and the first photoelectric conversion layer L1 corresponds to a lower layer. That is, the photoelectric conversion member 101 may be a stack type of imaging apparatus in which a plurality of photoelectric conversion layers are stacked.

A transparent electrode formed of (e.g., at least partially comprising), for example, ITO (Indium Tin Oxide) may be provided between the first photoelectric conversion layer L1 and the second photoelectric conversion layer L2. An example of the first photoelectric conversion layer L1 may include a substrate that is formed of (e.g., at least partially comprises) silicon and provided with the photoelectric conversion element. The transparent electrode may be electrically connected to a circuit formed on the substrate. An example of the second photoelectric conversion layer L2 may include an organic film.

In the example shown in FIG. 1, the first photoelectric conversion layer L1 includes red pixels (hereinafter referred to as "R pixels") and blue pixels (hereinafter referred to as "B pixels") formed on a substrate. The R pixels and B pixels may be formed, for example, by a conventional semiconductor process using silicon. The R pixels and the B pixels may be arranged, for example, in a checkered pattern. The arrangement of the R pixels and B pixels is not limited to the checkered pattern.

In the example shown in FIG. 1, the second photoelectric conversion layer L2 includes an organic photoelectric film that absorbs light having the green wavelength and is formed on an upper layer of the substrate on which the B pixels and the R pixels are formed.

In the example shown in FIG. 1, since green pixels (hereinafter referred to as "G pixels") exist over all the pixels of the photoelectric conversion member 101, no moiré may occur theoretically and color moiré may be greatly suppressed in signals generated by an imaging apparatus that includes the photoelectric conversion member 101.

However, in the photoelectric conversion member 101 shown in FIG. 1, when a material having high external quantum efficiency of the green is used as the second photoelectric conversion layer L2, a part of light having blue wavelength (e.g., blue light) or light having a red wavelength (e.g., red light) as well as light having a green wavelength (e.g., green light) may be absorbed in the second photoelectric conversion layer L2 when the photoelectric conversion is performed. Therefore, if each of the first photoelectric conversion layer L1 and the second photoelectric conversion layer L2 performs a color correction process on photoelectrically-converted signals and then outputs them, color reproducibility deterioration, noise resistance deterioration in a blue region or read region, and resolution deterioration may occur.

In addition, the example of the first photoelectric converting layer L1 and the second photoelectric converting layer L2 is not limited to the example shown in FIG. 1. For example, in the first photoelectric conversion layer L1, the R pixels, G pixels, and the B pixels may be formed on the substrate. In this case, the R pixels, the G pixels, and the B pixels may be arranged, for example, in a Bayer array. The second photoelectric conversion layer L2 may include an NIR layer that performs photoelectric conversion by absorbing light having a NIR wavelength. In a case where the first photoelectric conversion layer L1 and the second photoelectric conversion layer L2 have other configurations, the same problem as the configuration shown in FIG. 1 may also occur.

Therefore, a signal processing apparatus according to some example embodiments performs an absorption correction process on a signal generated by imaging in an imaging apparatus. The absorption correction process is performed by an absorption correction unit provided in the signal processing apparatus. In some example embodiments, the signal processing apparatus corrects a green light signal obtained by the photoelectric conversion in the second photoelectric conversion layer L2 by using at least one component of blue light or red light, which is absorbed in the second photoelectric conversion layer L2, to be photoelectrically converted in the first photoelectric conversion layer L1. In some example embodiments, the signal processing apparatus performs absorption correction on the green light signal obtained by photoelectric conversion in the second photoelectric conversion layer L2 by using at least one of a blue light signal or a red light signal obtained by the photoelectric conversion in the first photoelectric conversion layer L1. Accordingly, an influence of a light component having a wavelength which is photoelectrically converted in a lower layer and is absorbed in an upper layer may be reduced. An example of the absorption correction process will be described later.

Furthermore, as shown in FIG. 1, the G pixels exist over all the pixels of the photoelectric conversion member in the second photoelectric conversion layer L2, whereas the R pixels and the B pixels do not exist over all the pixels of the photoelectric conversion member in the first photoelectric conversion layer L1. Therefore, if the absorption correction is performed on the green light signal obtained by the photoelectric conversion in the second photoelectric conversion layer L2 by using at least one of the blue light signal or the red light signal obtained by the photoelectric conversion in the first photoelectric conversion layer L1, the absorption correction is performed on the green light signal in an arranged pattern of the R pixels or B pixels. As a result, color reproducibility and color resolution may be deteriorated.

Therefore, the signal processing apparatus according to some example embodiments interpolates at least one of the blue light signal or the red light signal obtained by the photoelectric conversion in the first photoelectric conversion layer L1 before performing the absorption correction on the green light signal obtained by the photoelectric conversion in the second photoelectric conversion layer L2. The interpolation process may be performed, for example, in an interpolation unit, a first interpolation unit, or a second interpolation unit included in the signal processing apparatus. Specifically, the signal processing apparatus may interpolate at least one of the blue light signal or the red light signal obtained by the photoelectric conversion in the first photoelectric conversion layer L1, using the green light signal obtained by the photoelectric conversion in the second photoelectric conversion layer L2. As a result, the absorption correction may be performed on the green light signal by using at least one of the interpolated blue light signal or red light signal so that the absorption correction on the green light signal may be at least partially or entirely prevented from being performed in an arranged pattern of the R pixels or B pixels. An example of the interpolation process will be described later.

In addition, the signal processing apparatus according to some example embodiments may further perform a color correction process after performing the absorption correction process on the signal generated by imaging in the imaging apparatus. As a result, the signal processing apparatus may reduce the influence of the color reproducibility deterioration, the noise resistance deterioration in the blue region or read region, and the resolution deterioration that may occur when the photoelectric conversion member in which the plurality of photoelectric conversion layers are stacked is used. Therefore, the signal processing apparatus may improve an image quality of the captured image. An example of the color correction process may include a process of performing fine color adjustment by matrix calculation using a color correction matrix. The color correction process may be performed in a color correction unit of the signal processing apparatus. An example of the color correction process will be described later. In the signal processing apparatus according to some example embodiments, a white balance process may be further performed.

The signal processing apparatus includes a processor (not shown) and a storage device (not shown). In some example embodiments, the processor may be a central processing unit (CPU). The CPU executes a program stored in the storage device thereby realizing all processes in the signal processing apparatus. For example, the CPU may realize the interpolation process, the absorption correction process, and the color correction process by executing the program stored in the storage device. That is, the CPU may function as an interpolation unit, an absorption correction unit, a first interpolation unit, a second interpolation unit, and a color correction unit according to some example embodiments by executing the program stored in the storage device. In some example embodiments, the processor may be a graphics processing unit (GPU). The interpolation process, the absorption correction process, and the color correction process in the signal processing apparatus may be realized by an image processing circuit implemented by the GPU in the signal processing apparatus.

First Example Embodiment

Figure 2:
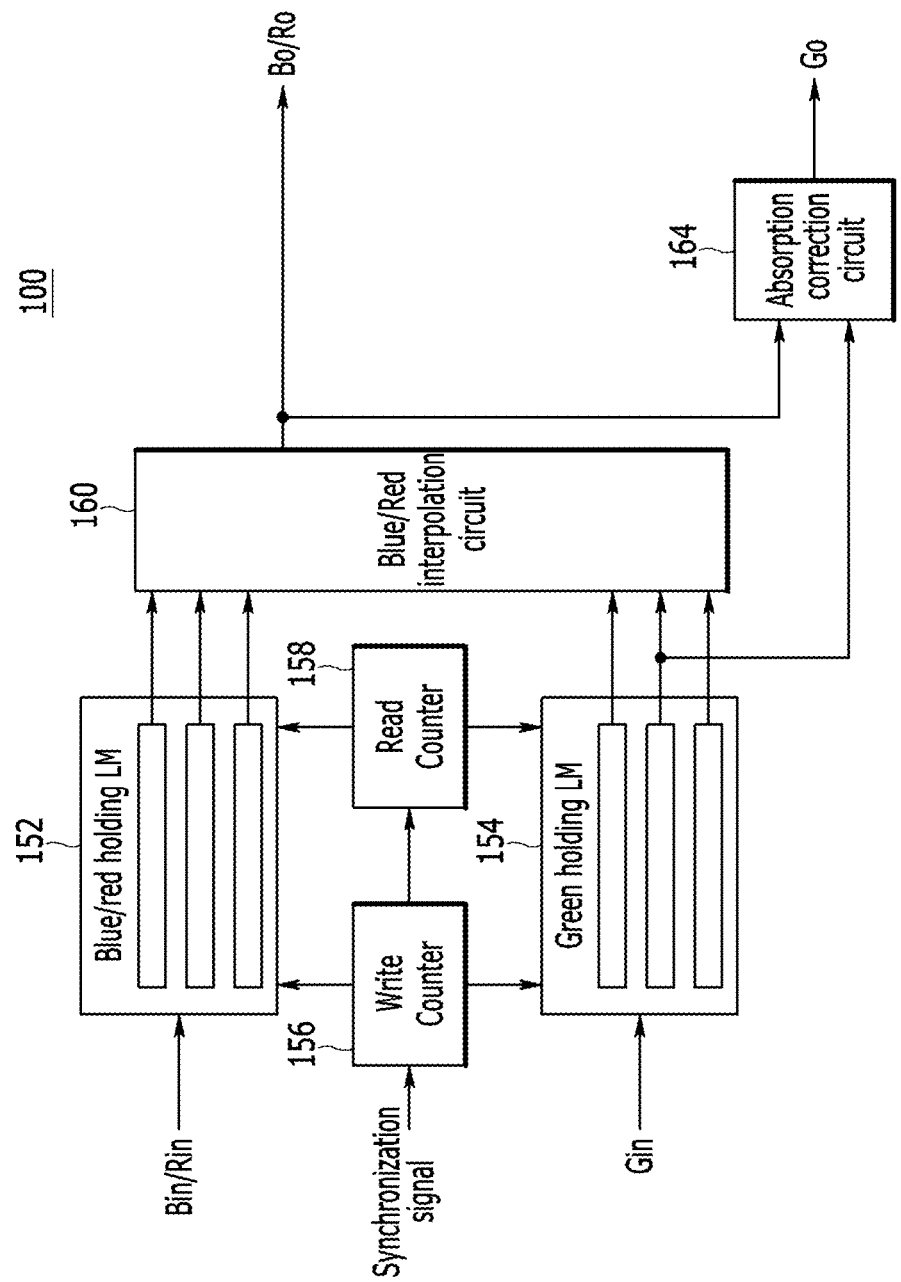
FIG. 2 is a diagram showing an example of a signal processing apparatus according to a first example embodiment.
Figure 3:
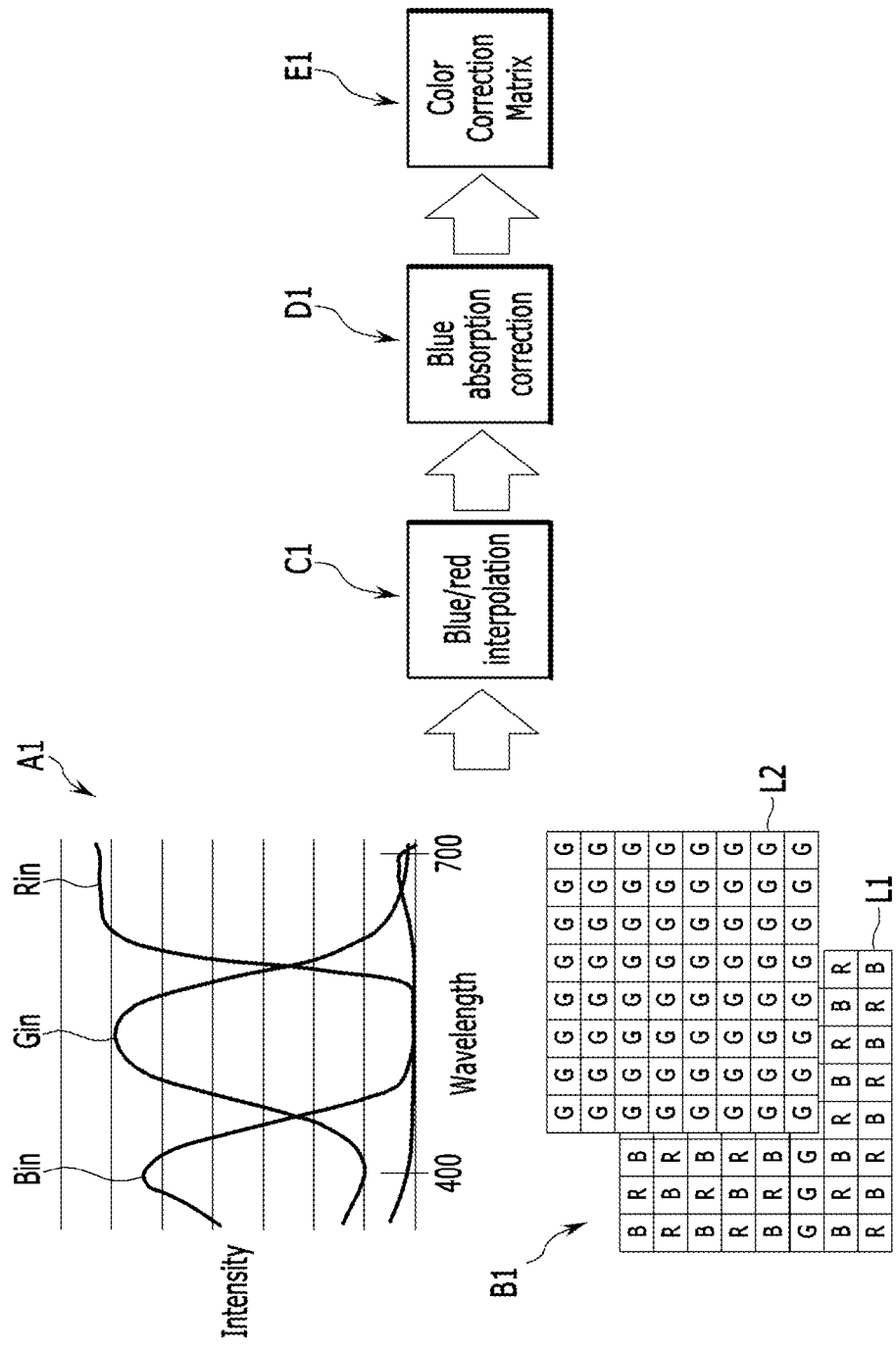
FIG. 3 is a diagram showing an example of a signal processing method according to a first example embodiment.

A signal processing apparatus 100 and a signal processing method according to a first example embodiment is described. FIG. 2 is a diagram showing an example of a signal processing apparatus 100 according to a first example embodiment, and FIG. 3 is a diagram showing an example of a signal processing method according to a first example embodiment.

Hereinafter, a first photoelectric conversion layer L1 and a second photoelectric conversion layer L2 are described as an example shown in FIG. 1. In the following description, it is described an example that a signal processing apparatus 100 performs an absorption correction process on each of a green light signal and a blue light signal or the green light signal based on the green light signal and the blue light signal. In some example embodiments, the signal processing apparatus 100 may perform the absorption correction process on each of the green light signal and a red light signal or the green light signal based on the green light signal and the red light signal. In yet some example embodiments, the signal processing apparatus 100 may perform the absorption correction process on each of the green light signal, the red light signal, and the blue light signal based on the green light signal, the red light signal, and the blue light signal.

As shown in FIG. 2, the signal processing apparatus 100 according to the first example embodiment includes a blue/red holding line memory (LM) 152, a green holding line memory (LM) 154, a write counter 156, a read counter 158, a blue/red interpolation circuit 160 serving as an interpolation unit (also referred to herein as an interpolation circuit), and an absorption correction circuit 164 serving as an absorption correction unit. In some example embodiments, the signal processing apparatus 100 may further include a color correction matrix circuit (not shown).

The blue/red holding line memory 152 is a line memory that holds a blue light signal Bin and a red light signal Rin input from a photoelectric conversion member. The green holding line memory 154 is a line memory that holds a green light signal Gin input from the photoelectric conversion member.

The write counter 156 controls write to each of the blue/red holding line memory 152 and the green holding line memory 154. Further, the read counter 158 controls read from each of the blue/red holding line memory 152 and the green holding line memory 154.

The write counter 156 and the read counter 158 count based on, for example, a change in a signal level of a synchronization signal transmitted from a CPU (not shown) of the signal processing apparatus 100 according to the first example embodiment. Then, each of the write counter 156 and the read counter 158 controls the blue/red holding line memory 152 and the green holding line memory 154 according to a count value. The control method in each of the write counter 156 and the read counter 158 is not particularly limited as long as a process shown in FIG. 3 may be implemented.

In some example embodiments, the blue/red interpolation circuit 160 is configured to interpolate at least one of a signal of a first light (e.g., blue light) or a signal of a second light (e.g., red light) obtained by photoelectric conversion in the first photoelectric conversion layer L1, based on a signal of a third light (e.g., green light) obtained by photoelectric conversion in the second photoelectric conversion layer L2. For example, the blue/red interpolation circuit 160 may perform interpolation on the blue light signal Bin and the red light signal Rin read from the blue/red holding line memory 152. In some example embodiments, the blue/red interpolation circuit 160 may be configured to interpolate the at least one of the signal of the first light (e.g., blue light signal Bin) or the signal of the second light (e.g., red light signal Rin) based on intensity gradient information of (e.g., associated with) the signal of the third light (e.g., green light signal Gin) obtained by photoelectric conversion in the second photoelectric conversion layer L2. Specifically, the blue/red interpolation circuit 160 may interpolate the blue light signal Bin and the red light signal Rin by referring to gradients (intensity gradient information) of pixel values of G pixels indicated by the green light signal Gin read from the green holding line memory 154.

The absorption correction circuit 164 performs an absorption correction process on the green light signal Gin based on the green light signal Gin read from the green holding line memory 154 and the interpolated blue light signal Bo. In some example embodiments, the absorption correction circuit 164 may also perform the absorption correction process on the interpolated blue light signal Bo. In some example embodiments, the absorption correction circuit 164 is configured to perform absorption correction on the signal of the third light (e.g., green light signal Gin), using at least one of the interpolated signal of the first light (e.g., blue light signal Bo) or the interpolated signal of the second light (e.g., red light signal Ro).

In some example embodiments, the blue light signal Bo and the red light signal Ro interpolated by the blue/red interpolation circuit 160 may be input to the color correction matrix circuit (not shown), and the green light signal Go which is absorption-corrected by the absorption correction circuit 164 may be input to the color correction matrix circuit. The color correction matrix circuit may perform a color correction process on the blue light signal Bo, the red light signal Ro, and the green light signal Go.

As shown in FIG. 3, a signal processing method according to the first example embodiment includes a blue/red interpolation process serving as an interpolation step C1, a blue absorption correction process serving as an absorption correction step, and a color correction matrix process serving as a color correction step E1.

A blue light signal Bin, a green light signal Gin, and a red light signal Rin designated by "A1" in FIG. 3 are input to an signal processing apparatus 100 from a photoelectric conversion member B1. The blue/red interpolation circuit 160 of the signal processing apparatus 100 then performs the blue/red interpolation process C1 on the blue light signal Bin and the red light signal Rin.

Next, the absorption correction circuit 164 of the signal processing apparatus 100 performs the blue absorption correction D1 on the green light signal Gin, using the blue light signal Bo on which the blue/red interpolation process is performed. In some example embodiments, in the blue absorption correction process D1, the absorption correction process may also be performed on the interpolated blue light signal Bo.

Subsequently, the color correction matrix circuit of the signal processing apparatus 100 may perform the color correction matrix process E1 on the blue light signal Bo, the red light signal Ro, and the green light signal Go.

Figure 4:
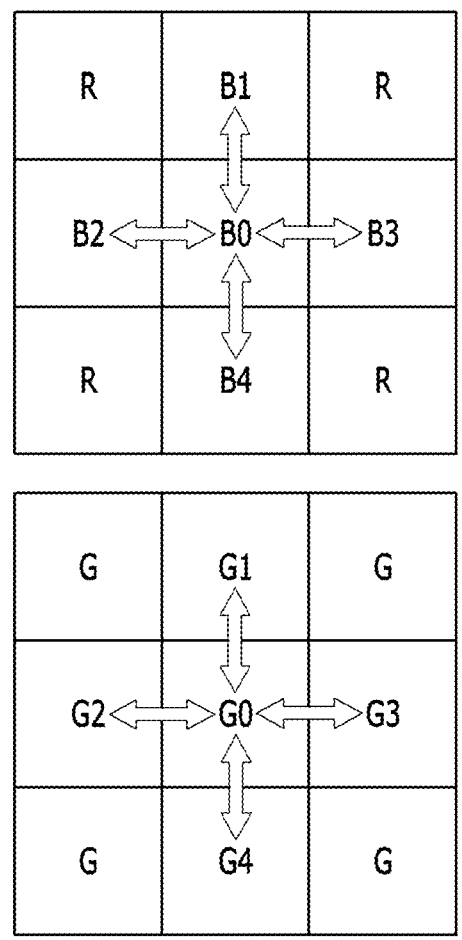
FIG. 4 is a diagram showing an example of a blue/red interpolation process in a signal processing apparatus according to a first example embodiment.
Figure 5:
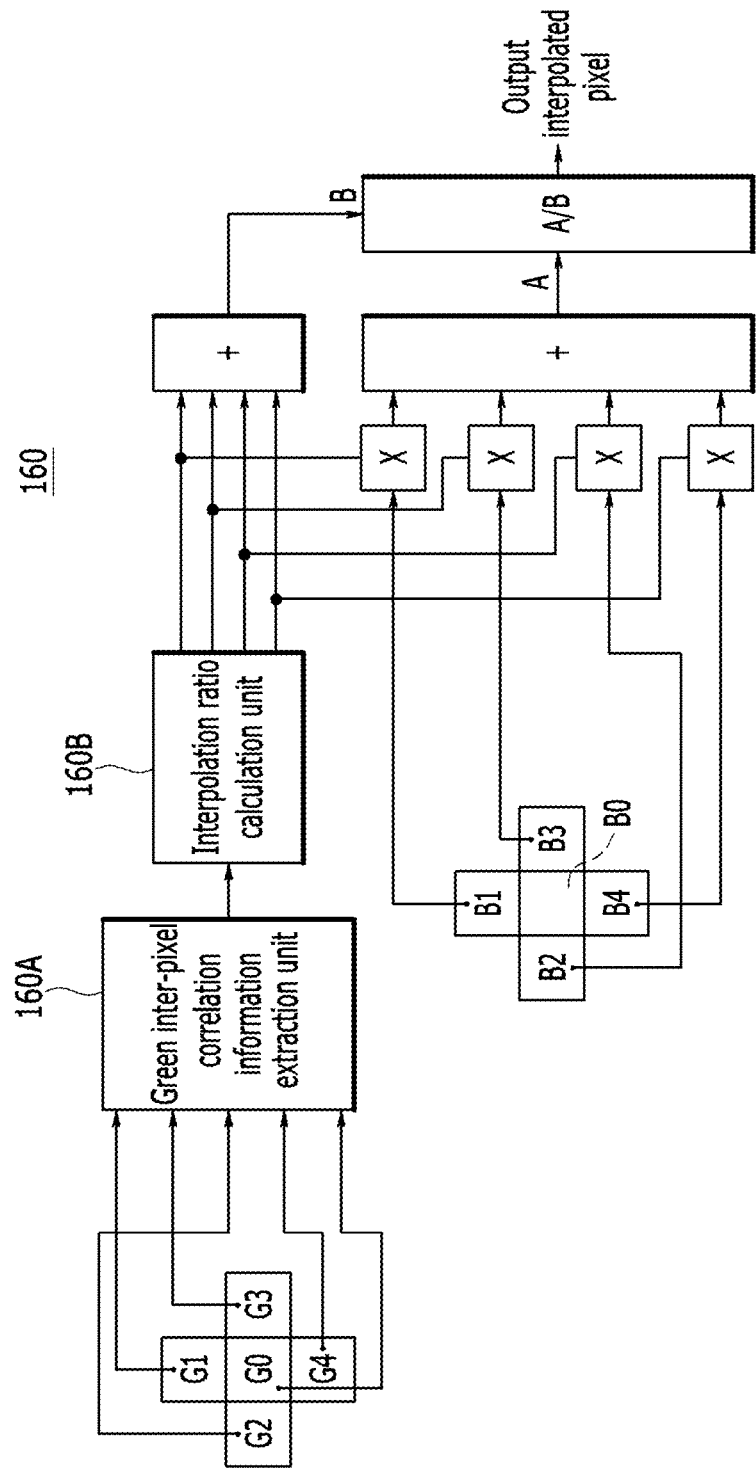
FIG. 5 is a diagram showing an example of an interpolation circuit in a signal processing apparatus according to a first example embodiment.

Hereinafter, an example of an interpolation process according to the first example embodiment is described with reference to FIG. 4 and FIG. 5. FIG. 4 is a diagram showing an example of a blue/red interpolation process in a signal processing apparatus 100. In FIG. 4, an upper side shows a block of 3×3 pixels in a first photoelectric conversion layer L1, and a lower side shows a block of 3×3 pixels in a second photoelectric conversion layer L2 corresponding to the block of 3×3 pixels in the upper side. FIG. 5 is a diagram showing an example of a blue/red interpolation circuit 160 in the signal processing apparatus 100.

As shown in FIG. 5, the blue/red interpolation circuit 160 includes a green inter-pixel correlation information extraction unit 160A and an interpolation ratio calculation unit 160B.

As shown in FIG. 4, R pixels and B pixels are arranged in a checkered pattern in the first photoelectric conversion layer L1. In the 3×3 pixel block shown in the upper side of FIG. 4, a center pixel (target pixel) is an R pixel, and a blue light signal Bin does not have spatial resolution information in the center pixel. Hereinafter, an example that the center pixel (target pixel) is interpolated by using surrounding pixels B1, B2, B3, and B4 of the center pixel in the 3×3 pixel block is described. The center pixel (target pixel) to be interpolated is denoted as B0. The blue/red interpolation circuit 160 may perform an interpolation process on a red light signal Rin in the same manner as described below.

The green inter-pixel correlation information extraction unit 160A extracts inter-pixel correlation information of a green light signal Gin. In some example embodiments, the green inter-pixel correlation information extraction unit 160A may extract, for example, gradient information (intensity gradient information) of pixel values among G pixels G0, G1, G2, G3, and G4 corresponding to the central pixel B0 and the pixels B1, B2, B3, and B4 in the 3×3 pixel block shown in FIG. 4. In some example embodiments, the green inter-pixel correlation information extraction unit 160A may calculate the gradient information $G1s$, $G2s$, $G3s$, and $G4s$ of the pixel values between the pixel G0 and each of the pixels G1, G2, G3, and G4 according to the following Equations 1 to 4.

$$G1s = \text{abs}(G1-G0) \qquad \text{Equation 1}$$

$$G2s = \text{abs}(G2-G0) \qquad \text{Equation 2}$$

$$G3s = \text{abs}(G3-G0) \qquad \text{Equation 3}$$

$$G4s = \text{abs}(G4-G0) \qquad \text{Equation 4}$$

In Equations 1 to 4, abs( ) is a function for outputting an absolute value.

The interpolation ratio calculation unit 160B may compare the gradient information G1s, G2s, G3s, and G4s of the pixel values between the pixel G0 and each of the pixels G1, G2, G3, and G4 calculated by the green inter-pixel correlation information extraction unit 160A, and calculate the smallest gradient of pixel values as an interpolation ratio. Then, the interpolation ratio calculation unit 160B may interpolate the center pixel B0 of the block shown on the upper side of FIG. 4, using the smallest gradient (interpolation ratio) of the pixel value. In some example embodiments, the interpolation ratio calculation unit 160B may calculate the interpolation ratio according to the following Equations 5 to 8, and interpolate the central pixel B0 of the block shown on the upper side of FIG. 4.

$$\text{If}(G1s == \min(G1s,G2s,G3s,G4s))$$

$$B0 = (B1 \times G1)/G0 \qquad \text{Equation 5}$$

$$\text{If}(G2s == \min(G1s,G2s,G3s,G4s))$$

$$B0 = (B2x\ G2)/G0 \qquad \text{Equation 6}$$

$$\text{If}(G3s == \min(G1s,G2s,G3s,G4s))$$

$$B0 = (B3x\ G3)/G0 \qquad \text{Equation 7}$$

$$\text{If}(G4s == \min(G1s,G2s,G3s,G4s))$$

$$B0 = (B4x\ G4)/G0 \qquad \text{Equation 8}$$

Next, an example of an absorption correction process according to the first example embodiment is described.

An absorption correction circuit 164 performs blue absorption correction on a green light signal Gin, using the blue light signal Bo on which the blue/red interpolation is performed. In some example embodiments, the absorption correction circuit 164 may determine a correction value α in consideration of a blue light component that is absorbed in a second photoelectric conversion layer L2. Then, the absorption correction circuit 164 may subtract a value obtained by multiplying a value (signal value) of a blue light signal Bin by α/(1−α) from the green light signal Gin, thereby performing the blue absorption correction on the green light signal Gin. Restated, in some example embodiments, the absorption correction circuit 164 may perform absorption correction on a signal of the third light (e.g., green light signal Gin) by subtracting a value obtained by multiplying a value of the signal of the first light (e.g., blue light signal Bin) by α/(1−α) from the signal of the third light, the α being a correction value determined in consideration of at least one of a component of the first light (e.g., the blue light) and a component of the second light (e.g., red light) absorbed by the second photoelectric conversion layer L2.

Figure 6A:
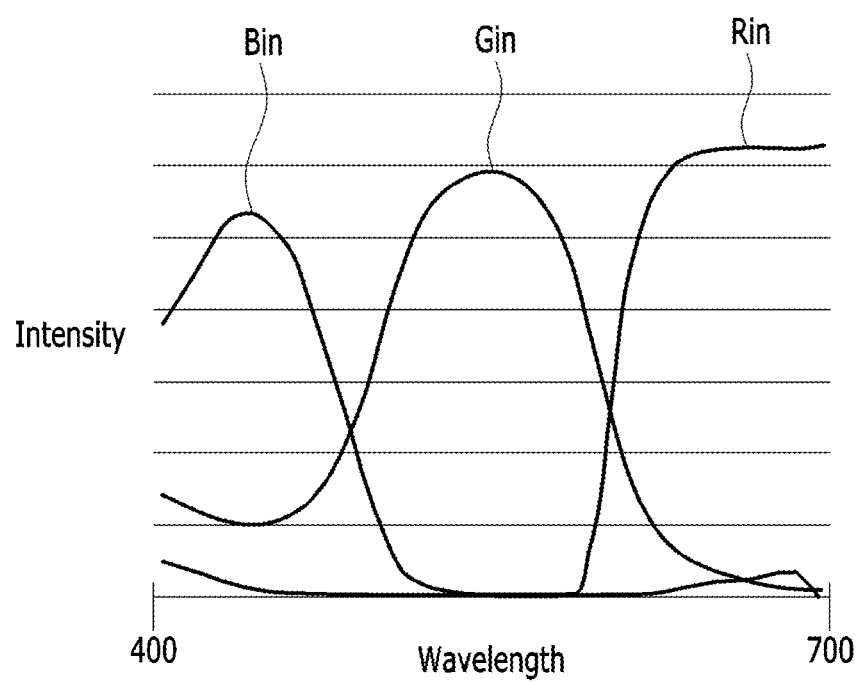
FIG. 6A and FIG. 6B are a diagram showing an example of a result of absorption correction in a signal processing apparatus according to a first example embodiment.
Figure 6B:
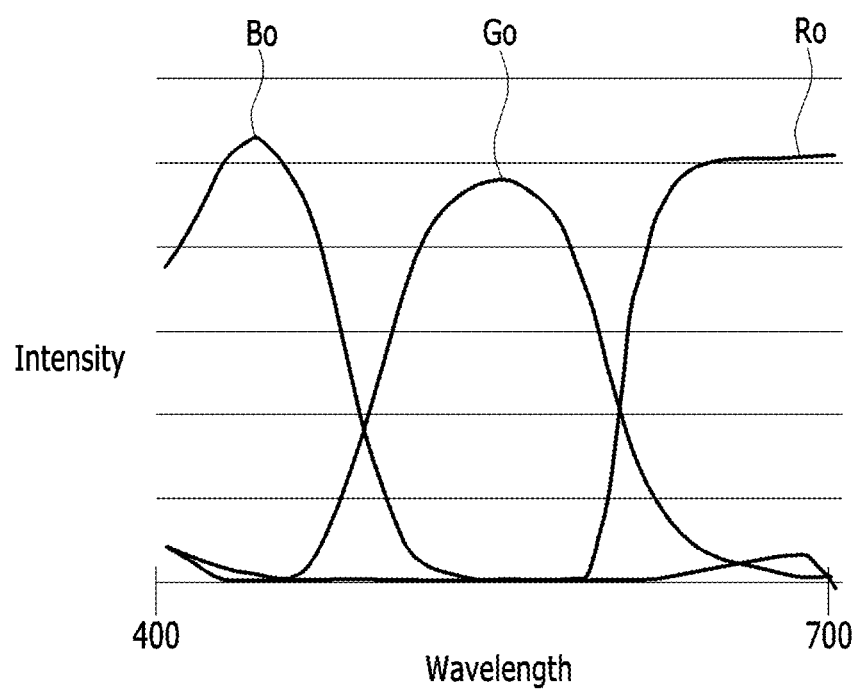

FIG. 6A and FIG. 6B show an example of a result of absorption correction in a signal processing apparatus 100 according to the first example embodiment. FIG. 6A shows intensity distributions of the red light signal Rin, the green light signal Gin, and the blue light signal Bin that are input to the signal processing apparatus 100 from the photoelectric conversion member. Further, FIG. 6B shows intensity distributions of the interpolated red light signal Ro, the absorption-corrected green light signal Go, and the interpolated and absorption-corrected blue light signal Bo.

Further, examples of the correction value α may include following examples. The correction value α is not limited to the following examples.

Example 1: a minimum value (Gbottom) in a blue region of the green light signal Gin generated by the second photoelectric conversion layer L2

Example 2: an absorption rate (Gabs) of the green light absorbed by the second photoelectric conversion layer L2 at the wavelength having a peak value of the blue light signal Bin generated by the first photoelectric conversion layer L1

When the correction value α is Gbottom shown in Example 1, the absorption correction circuit 164 may calculate Gbottom as the correction value α according to Equation 9.

$$Go = Gin - G\text{bottom} \qquad \text{Equation 9}$$

When the correction value α is Gabs shown in Example 2, the absorption correction circuit 164 may calculate Gabs as the correction value α according to the Equation 10.

$$Go = Gin - Gabs \qquad \text{Equation 10}$$

In some example embodiments, the absorption correction circuit 164 may perform a blue absorption correction on the blue light signal Bo after the interpolation process, according to Equation 11 or 12.

$$Bo' = Bo + G\text{bottom} \qquad \text{Equation 11}$$

$$Bo' = Bo + Gabs \qquad \text{Equation 12}$$

In some example embodiments, as described above, the absorption correction circuit 164 may perform a red absorption correction on the green light signal Gin, using the red light signal Ro on which the blue/red interpolation process is performed. In some example embodiments, the absorption correction circuit 164 may determine a correction value α' in consideration of a red light component absorbed by the second photoelectric conversion layer L2. The absorption correction circuit 164 may subtract a value obtained by multiplying a value of the red light signal Rin by α'/(1−α') from the green light signal Gin, thereby performing the red absorption correction on the green light signal Gin.

Further, examples of the correction value α' may include the following examples. The correction value α' is not limited to the following examples.

Example 1: a minimum value Gbottom' in the red region of the green light signal Gin generated by the second photoelectric conversion layer L2.

Example 2: an absorption rate Gabs' of the green light absorbed by the second photoelectric conversion layer L2 at the wavelength having the peak value of the red light signal Rin generated by the first photoelectric conversion layer L1.

When the correction value α' is Gbottom' shown in Example 1, the absorption correction circuit 164 may calculate Gbottom' as the correction value α' according to Equation 13.

$$Go = Gin - G\text{bottom} \qquad \text{Equation 13}$$

When the correction value α' is Gabs' shown in Example 2, the absorption correction circuit 164 may calculate Gabs' as the correction value α' according to Equation 14.

$$Go = Gin - Gabs' \qquad \text{Equation 14}$$

In some example embodiments, the absorption correction circuit 164 may perform the red absorption correction on the red light signal Ro on which the interpolation process is performed, according to Equation 15 or 16.

$$Ro' = Ro + G\text{bottom}'  \qquad \text{Equation 15}$$

$$Ro' = Ro + G\text{abs}'  \qquad \text{Equation 16}$$

Next, an example of a color correction process according to the first example embodiment is described.

A color correction matrix circuit (not shown) of the signal processing apparatus 100 performs a color correction process on the interpolated blue light signal Bo, the interpolated red light signal Ro, and the absorption-corrected green light signal Go. In some example embodiments, the color correction matrix circuit may perform the color correction process on the interpolated and absorption-corrected blue light signal Bo' instead of the interpolated blue light signal Bo. In some example embodiments, the color correction matrix circuit may perform the color correction process on the interpolated and absorption-corrected red light signal Ro' instead of the interpolated red light signal Ro.

In some example embodiments, the color correction matrix circuit may perform the color correction process according to Equation 17. That is, the color correction matrix circuit may perform the color correction process by performing a matrix operation using a color correction matrix that is a 3×3 matrix as in Equation 17. In Equation 17, Rin denotes the interpolated red light signal Ro or the interpolated and absorption-corrected red light signal Ro', Gin denotes the absorption-corrected green light signal Go, and Bin denotes the interpolated blue light signal Bo or the interpolated and absorption-corrected blue light signal Bo'. The color correction process according to the first example embodiment is not limited to the matrix calculation using the color correction matrix.

$$\begin{cases} Ro = Rin \times C00 + Gin + C01 + Bin \times C02 \\ Go = Rin \times C10 + Gin + C11 + Bin \times C12 \\ Bo = Rin \times C20 + Gin + C21 + Bin \times C22 \end{cases} \qquad \text{Equation 17}$$

In the signal processing apparatus 100 and the signal processing method according to the first example embodiment described above, at least one of the blue light signal Bin or the red light signal Rin is interpolated by the interpolation circuit 160 based on using the green light signal Gin before the absorption correction of the green light signal Gin is performed. Therefore, the absorption correction of the green light signal Gin may be performed by using at least one of the interpolated blue light signal Bo or the red light signal Ro. That is, it is possible to prevent the absorption correction of the green light signal Gin from being performed in a checkered pattern. As a result, the signal processing apparatus 100 and the signal processing method according to the first example embodiment may perform the signal processing with the excellent color reproducibility and color resolution.

In addition, since the second photoelectric conversion layer L2 partially absorbs the blue light and the red light, the blue light component and the red light component may be partially included in the green light signal Gin obtained by photoelectric conversion in the second photoelectric conversion layer L2. Therefore, in some example embodiments, the blue light signal Bin and the red light signal Rin obtained by photoelectric conversion in the first photoelectric conversion layer L1 are interpolated by using the gradient information (intensity gradient information) of the pixel values of the green light signal Gin obtained by photoelectric conversion in the second photoelectric conversion layer L2, so that the interpolation may be performed with the higher accuracy.

In some example embodiments, the absorption correction of the green light signal Gin may be performed by using the correction value α determined in consideration of the blue light component that is partially absorbed by the second photoelectric conversion layer L2, or the correction value α' determined in consideration of the red light component that is partially absorbed by the second photoelectric conversion layer L2, so that the absorption correction may be performed with the higher accuracy.

In some example embodiments, the absorption correction of the interpolated blue light signal Bo may be performed by using the correction value α determined in consideration of the blue light component that is partially absorbed by the second photoelectric conversion layer L2, so that the absorption correction may be performed with the higher accuracy. In some example embodiments, the absorption correction of the interpolated red light signal Ro may be performed by using the correction value α' determined in consideration of the red light component that is partially absorbed by the second photoelectric conversion layer L2, so that the absorption correction may be performed with the higher accuracy.

Second Example Embodiment

Figure 7:
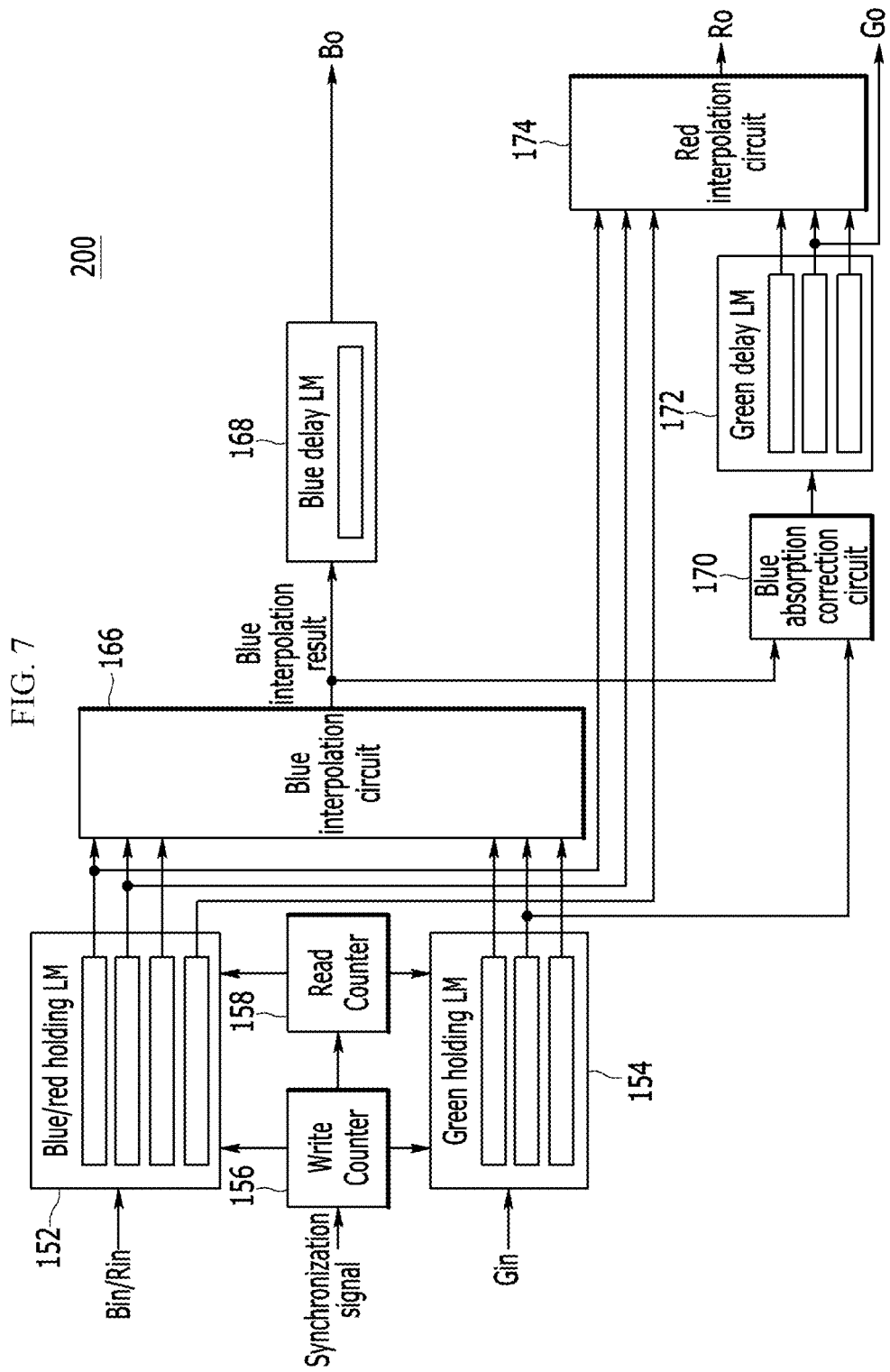
FIG. 7 is a diagram showing an example of a signal processing apparatus according to a second example embodiment.
Figure 8:
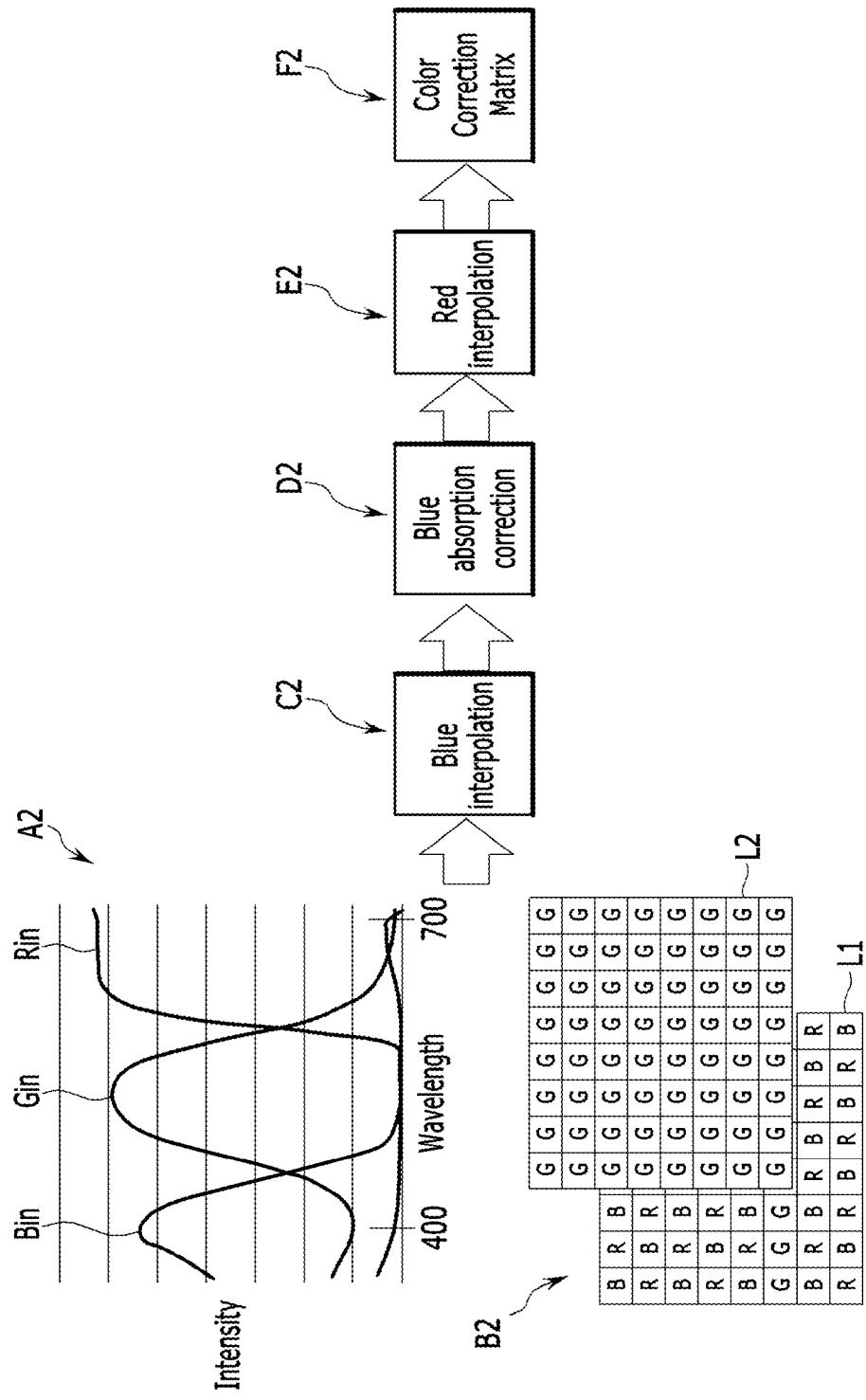
FIG. 8 is a diagram showing an example of a signal processing method according to a second example embodiment.
Figure 9:
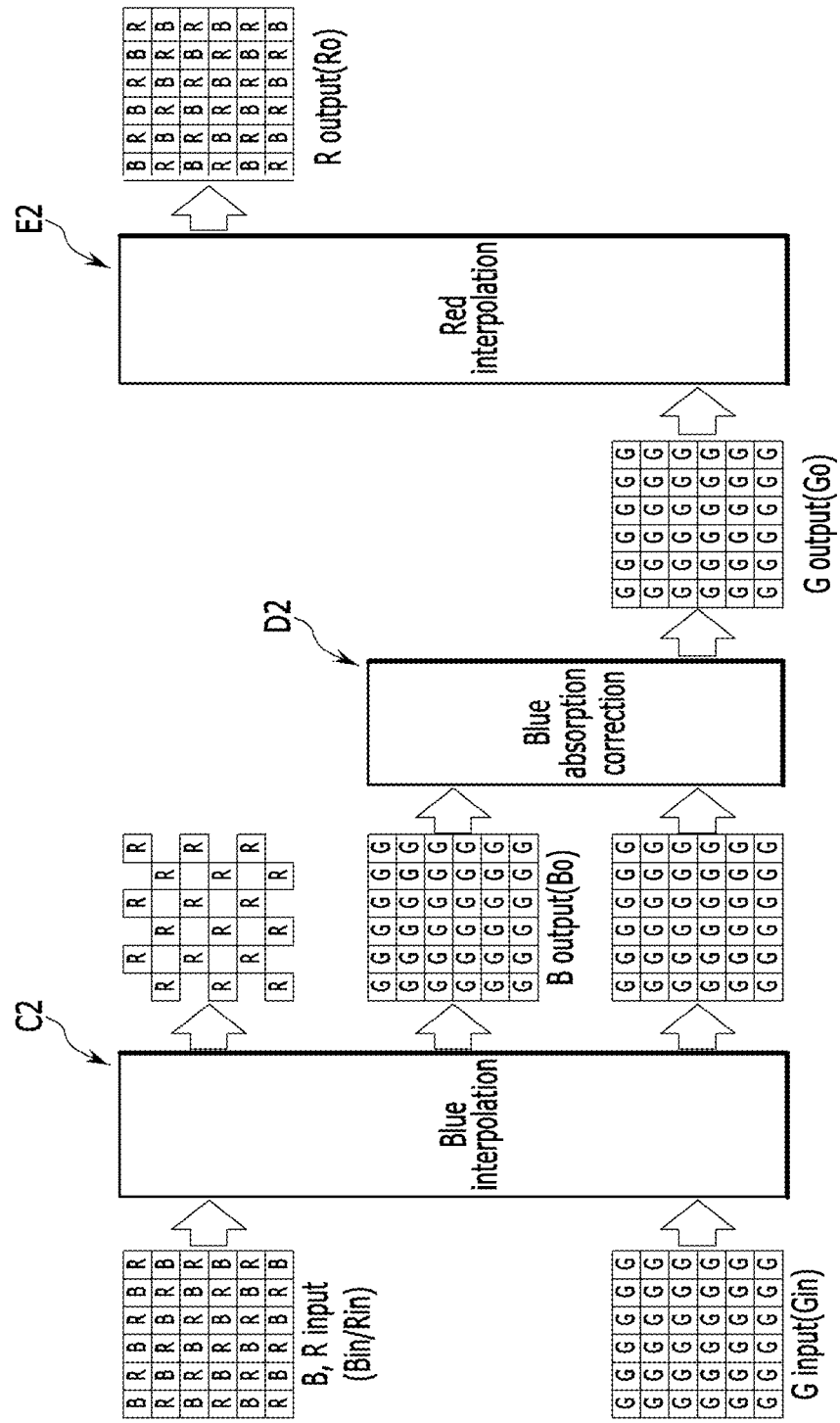
FIG. 9 is a diagram showing an interpolation process, an absorption correction process, and an interpolation process shown in FIG. 8.

Next, a second example embodiment of the present inventive concepts is described with reference to FIG. 7 to FIG. 9. FIG. 7 is a diagram showing an example of a signal processing apparatus 200 according to a second example embodiment. FIG. 8 is a diagram showing an example of a signal processing method according to a second example embodiment. FIG. 9 is a diagram showing an interpolation process, an absorption correction process, and an interpolation process shown in FIG. 8.

As shown in FIG. 7, the signal processing apparatus 200 according to the second example embodiment does not include a blue/red interpolation circuit 160, a blue/red delay line memory 162, and an absorption correction circuit 164, and includes a blue interpolation circuit 166 serving as a first interpolation unit (also referred to herein as a first interpolation circuit), a blue delay line memory 168, a blue absorption correction circuit 170 serving as a first absorption correction unit (also referred to herein as a first absorption circuit), a green delay line memory 172, a red interpolation circuit 174 serving as a second interpolation unit, differently from the signal processing apparatus 100 according to the first example embodiment. Hereinafter, in the signal processing apparatus 200 according to the second example embodiment, the same elements as those of the signal processing apparatus 100 according to the first example embodiment are designated by the same reference numerals, and their descriptions are omitted.

In some example embodiments, the blue interpolation circuit 166 is configured to interpolate a signal of the first light (e.g., blue light signal Bin) obtained by photoelectric conversion in the first photoelectric conversion layer L1, based on a signal of the third light (e.g., green light signal Gin) obtained by photoelectric conversion in the second photoelectric conversion layer L2. For example, the blue interpolation circuit 166 may interpolate a blue light signal Bin read from the blue/red holding line memory 152. In some example embodiments, the blue interpolation circuit 166 is configured to interpolate the signal of the first light (e.g., blue light signal Bin) obtained by photoelectric conversion in the first photoelectric conversion layer L1, based on intensity gradient information of (e.g., associated with) the signal of the third light (e.g., green light signal Gin) obtained by photoelectric conversion in the second photoelectric conversion layer L2. For example, the blue interpolation circuit 166 may interpolate the blue light signal Bin by referring to gradients (intensity gradient information) of pixel values of G pixels indicated by a green light signal Gin read from the green holding line memory 154.

The blue delay line memory 168 is a line memory that holds the interpolated blue light signal Bo obtained as a processing result in the blue interpolation circuit 166. For example, the blue delay line memory 168 functions as a delay element that delays an output of the interpolated blue light signal Bo by a time synchronized with an output of the green light signal or an output of the red light signal.

In some example embodiments, the blue absorption correction circuit 170 may perform absorption correction on the signal of the third light (e.g., green light signal Gin), using the interpolated signal of the first light (e.g., blue light signal Bo). The blue absorption correction circuit 170 may perform an absorption correction process on the green light signal Gin based on the green light signal Gin read from the green holding line memory 154 and the interpolated blue light signal Bo. In some example embodiments, the blue absorption correction circuit 170 may perform an absorption correction process on the interpolated blue light signal Bo. In some example embodiments, the blue absorption correction unit 170 may perform the absorption correction on the signal of the third light by subtracting a value obtained by multiplying a value of the signal of the first light by $\alpha/(1-\alpha)$ from the signal of the third light, the $\alpha$ being a correction value determined in consideration of a component of the first light absorbed by the second photoelectric conversion layer L2.

The green delay line memory 172 is a line memory that holds a green light signal Go obtained as a processing result in the blue absorption correction circuit 170. The green delay line memory 172 functions as a delay element that delays an output of the green light signal Go by a time synchronized with an output of the blue light signal Bo.

In some example embodiments, the red interpolation circuit 174 is configured to interpolate a signal of the second light (e.g., red light signal Rin) obtained by photoelectric conversion in the first photoelectric conversion layer L1, based on the absorption-corrected signal of the third light. For example, the red interpolation circuit 174 may perform interpolation on the red light signal Rin read from the blue/red holding line memory 152. In some example embodiments, the red interpolation circuit 174 is configured to interpolate the signal of the second light (e.g., red light signal Rin) obtained by photoelectric conversion in the first photoelectric conversion layer, based on intensity gradient information of the absorption-corrected signal of the third light. For example, the red interpolation circuit 174 may interpolate the red light signal Rin by referring to gradients (intensity gradient information) of pixel values of G pixels indicated by the green light signal Go read from the green delay line memory 172.

In some example embodiments, the blue light signal Bo interpolated by the blue interpolation circuit 166 may be input to a color correction matrix circuit (not shown) through the blue delay line memory 168, the green light signal Go on which the absorption correction process is performed by the blue absorption correction circuit 170 may be input to the color correction matrix circuit, and the red light signal Ro interpolated by the red interpolation circuit 174 may be input to the color correction matrix circuit. The color correction matrix circuit performs a color correction process on the blue light signal Bo, the red light signal Ro, and the green light signal Go.

As shown in FIG. 8, the signal processing method according to the second example embodiment includes a blue interpolation process C2 serving as a first interpolation step, and a blue absorption correction processing D2 serving as a first absorption correction step, a red interpolation process E2 serving as a second interpolation step, and a color correction matrix process F2 as a color correction step.

A blue light signal Bin, a green light signal Gin, and a red light signal Rin designated by "A2" in FIG. 8 are input to the signal processing apparatus 200 from a photoelectric conversion member B2. The blue interpolation circuit 166 of the signal processing apparatus 200 then performs the blue interpolation process C2 on the blue light signal Bin.

Next, the blue absorption correction circuit 170 of the signal processing apparatus 200 performs the blue absorption correction process D2 on the green light signal Gin, using the blue light signal Bo on which the blue interpolation process is performed. In some example embodiments, in the blue absorption correction process D2, the absorption correction process may also be performed on the interpolated blue light signal Bo.

Subsequently, the red interpolation circuit 174 of the signal processing apparatus 200 performs the red interpolation process E2 on the red light signal Rin.

Next, in some example embodiments, the color correction matrix circuit of the signal processing apparatus 200 may perform color correction matrix process (color correction process) F2 on the blue light signal Bo, the red light signal Ro, and the green light signal Go. The color correction process in the signal processing apparatus 200 is the same as the color correction processing in the signal processing apparatus 100 according to the first example embodiment, and the description thereof is omitted.

Hereinafter, the interpolation process C2, the absorption correction process D2, and the interpolation process E2 are described with reference to FIG. 9.

As shown in FIG. 9, the signal processing apparatus 200 according to the second example embodiment first performs interpolation C2 the blue light signal Bin. When red pixels and blue pixels are arranged in a checkered pattern in a first photoelectric conversion layer L1, there are red pixels and blue pixels having no pixel value. Therefore, the signal processing apparatus 200 first performs the interpolation on the blue light signal Bin. In some example embodiments, the signal processing apparatus 200 may first perform the interpolation on the red light signal Rin.

In some example embodiments, the signal processing apparatus 200 may perform the interpolation on the blue light signal Bin by referring to gradients (intensity gradient information) of pixel values of G pixels indicated by the green light signal Gin, for example. A reason for performing the interpolation by referring to the gradients of the G pixel values is, for example, that the pixel values exist over all the G pixels, the images of the respective colors are correlated with each other, and green has the highest contribution to luminance. In addition, since the green light signal Gin includes the blue light component absorbed by a second photoelectric conversion layer L2, the interpolation may be performed with the higher accuracy by performing the interpolation by referring to the gradients of the G pixel values. The interpolation process in the signal processing apparatus 200 is the same as the interpolation process in the signal processing apparatus 100 according to the first example embodiment, and the description thereof is omitted.

After the blue light signal Bin is interpolated, the signal processing apparatus 200 performs the absorption correction process D2 on the green light signal Gin based on the green light signal Gin and the interpolated blue light signal Bo. The absorption correction process in the signal processing apparatus 200 is the same as the absorption correction process in the signal processing apparatus 100 according to the first example embodiment, and the description thereof is omitted. The green light signal with high color reproducibility may be generated by performing the absorption correction process on the green light signal Gin.

After the absorption correction process is performed on the green light signal Gin, the signal processing apparatus 200 performs the interpolation E2 on the red light signal Rin.

For example, the signal processing apparatus 200 performs the interpolation on the red light signal Rin by referring to the gradients (intensity gradient information) of the pixel values of the G pixels indicated by the absorption-corrected green light signal Go after the absorption correction process is performed. In the pixel values of the G pixels after the absorption correction process is performed, the influence of the blue light component absorbed by the second photoelectric conversion layer L2 is removed. Therefore, an adverse effect which the gradients of the pixel values of the B pixels has on the interpolation of the red light signal Rin may be reduced by performing the interpolation by referring to the gradients of the pixel values of the G pixels after the absorption correction process is performed. The interpolation process in the signal processing apparatus 200 is the same as the interpolation process in the signal processing apparatus 100 according to the first example embodiment, and the description thereof is omitted.

In the signal processing apparatus 200 and the signal processing method according to the second example embodiment described above, the same effects as those of the signal processing apparatus 100 and the signal processing method according to the first example embodiment may be obtained. Since the red light signal Rin is interpolated by using the absorption-corrected green light signal Go, the red light signal Bin may be interpolated by removing the component of the blue light signal Bin included in the green light signal Gin. As a result, the red light signal Rin may be interpolated with the higher accuracy.

First and Second Example Embodiments and Comparative Example

Hereinafter, the first and second example embodiments and a comparative example are described.

A signal processing method in a signal processing apparatus according to comparative example is described with reference to FIG. 10.

Figure 10:
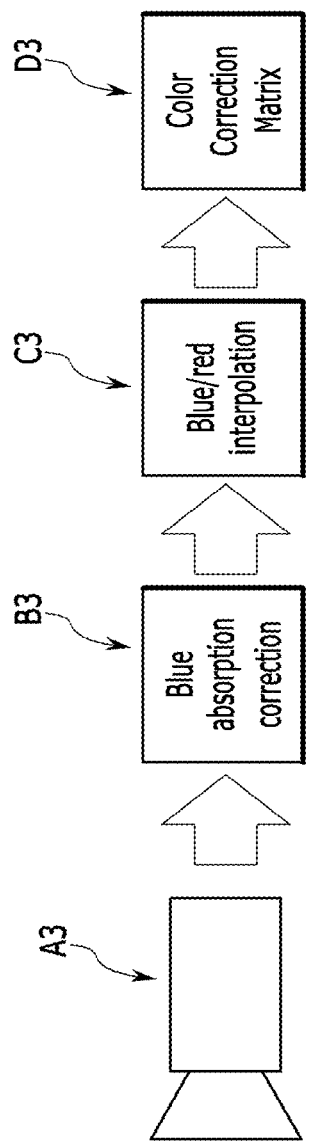
FIG. 10 is a diagram showing an example of a conventional signal processing method.

First, as shown in FIG. 10, a red light signal Rin, a green light signal Gin, and a blue light signal Bin generated by a photoelectric conversion member are input to the signal processing apparatus according to the comparative example from an imaging unit A3. The imaging unit of the comparative example and the photoelectric conversion member provided in the imaging unit are the same as those in the first and second example embodiments. That is, B pixels and R pixels are arranged in, for example, a checkered pattern in a first photoelectric conversion layer L1 of the photoelectric conversion member, and G pixels are arranged over all the pixels of a second photoelectric conversion layer L2.

Next, the signal processing apparatus according to the comparative example performs a blue absorption correction B3 on the green light signal Gin, using the blue light signal Bin input from the imaging unit. Here, the blue light signal Bin used in the blue absorption correction process B3 of the green light signal Gin is not interpolated. That is, in the signal processing apparatus according to the comparative example, the blue absorption correction B3 of the green light signal Gin is performed in the checkered pattern.

Subsequently, the signal processing apparatus according to the comparative example performs an interpolation process C3 on the blue light signal Bin and the red light signal Rin input from the imaging unit.

Next, the signal processing apparatus according to the comparative example performs a color correction matrix process (color correction processing) D2 on the green light signal Go on which the blue absorption correction process is performed, and the blue light signal Bo and the red light signal Ro on which the interpolation process is performed.

Figure 11:
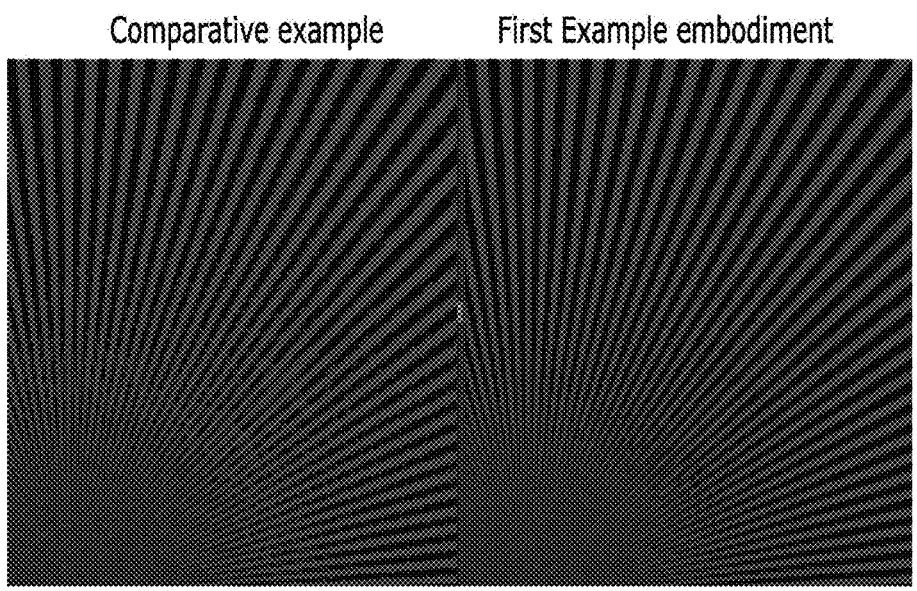
FIG. 11 is a diagram showing an image output by a signal processing method according to a first example embodiment and an image output by the signal processing method according to a comparative example.

FIG. 11 shows output images when a chart in which a region having pixel values of (R, G, B)=(0%, 25%, 100%) and a region having pixel values of (R, G, B)=(0%, 0%, 0%) are alternately arranged is input to the signal processing apparatus according to the first example embodiment and the signal processing apparatus according to the comparative example. In the chart, the B pixels and the R pixels are arranged in a checkered pattern. A right side of FIG. 11 shows the image output from the signal processing apparatus according to the first example embodiment, and a left side of FIG. 11 shows the image output from the signal processing apparatus according to the comparative example. In the images shown in FIG. 11, the color correction matrix process (color correction process) on the input image (chart) is not performed. That is, the image shown on the right side of FIG. 11 is an image obtained by performing the interpolation on the blue light signal Bin using the intensity gradient information of the green light signal Gin in the input image (chart), and then performing the absorption correction on the green light signal Gin using the interpolated blue light signal Bo. Further, the image shown on the left side of FIG. 11 is an image obtained by performing the absorption correction on the green light signal Gin using the blue light signal Bin of the input image (chart), and then performing the interpolation on the blue light signal Bin using the absorption-corrected green light signal Go.

As shown in FIG. 11, it may be seen that the first example embodiment is superior in the color reproducibility and color resolution as compared with the comparative example.

Figure 12:
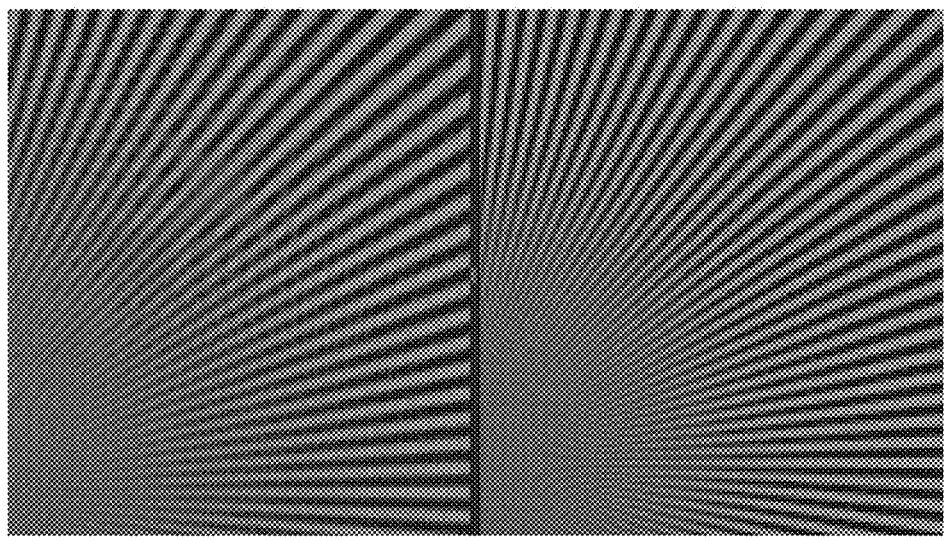
FIG. 12 is a diagram showing an image output by a signal processing method according to a first example embodiment and an image output by the signal processing method according to a comparative example.
Figure 13:
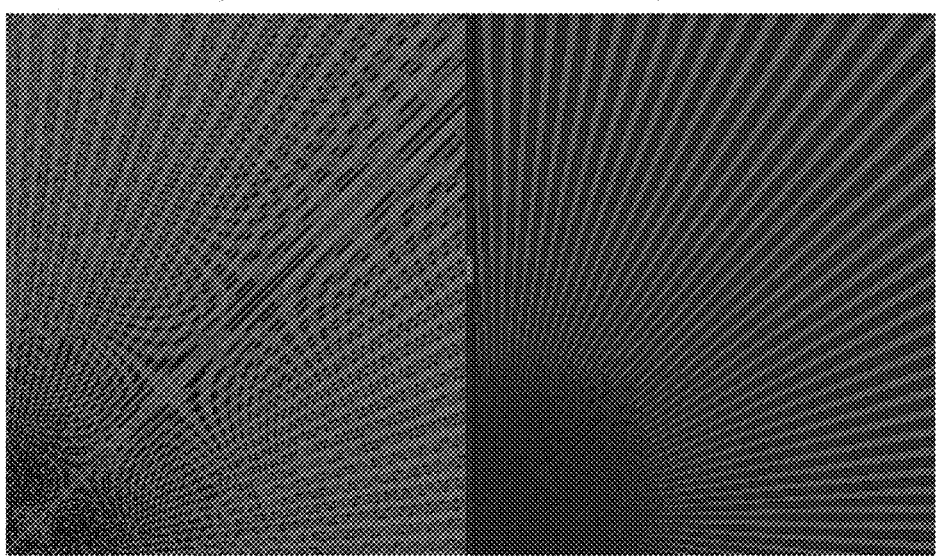
FIG. 13 is a diagram showing an image output by a signal processing method according to a first example embodiment and an image output by the signal processing method according to a second example embodiment.

FIG. 12 shows output images when a chart in which a region having pixel values of (R, G, B)=(100%, 25%, 100%) and a region having pixel values of (R, G, B)=(0%, 0%, 0%) are alternately arranged is input to the signal processing apparatus according to the first example embodiment and the signal processing apparatus according to the comparative example. In the chart, the B pixels and the R pixels are arranged in a checkered pattern. A right side of FIG. 12 shows the image output from the signal processing apparatus according to the first example embodiment, and a left side of FIG. 12 shows the image output from the signal processing apparatus according to the comparative example. In the images shown in FIG. 12, the color correction matrix process (color correction process) on the input image (chart) is not performed. That is, the image shown on the right side of FIG. 13 is an image obtained by performing the interpolation on the blue light signal Bin and the red light signal Rin using the intensity gradient information of the green light signal Gin in the input image (chart), and then performing the absorption correction on the green light signal Gin using the interpolated blue light signal Bo. Further, the image shown on the left side of FIG. 11 is an image obtained by performing the absorption correction on the green light signal Gin using the blue light signal Bin of the input image (chart), and then performing the interpolation on the blue light signal Bin and the red light signal Rin using the absorption-corrected green light signal Go.

As shown in FIG. 12, it may be seen that the first example embodiment is superior in the color reproducibility and color resolution as compared with the comparative example.

FIG. 13 shows output images when a chart in which a region having pixel values of (R, G, B)=(100%, 0%, 0%) and a region having pixel values of (R, G, B)=(0%, 0%, 100%) are alternately arranged is input to the signal processing apparatus according to the first example embodiment and the signal processing apparatus according to the second example embodiment. In the chart, the B pixels and the R pixels are arranged in a checkered pattern. A right side of FIG. 13 shows the image output from the signal processing apparatus according to the second example embodiment, and a left side of FIG. 12 shows the image output from the signal processing apparatus according to the first example embodiment. In the images shown in FIG. 13, the color correction matrix process (color correction process) on the input image (chart) is not performed. That is, the image shown on the right side of FIG. 13 is an image obtained by performing the interpolation on the blue light signal Bin using the intensity gradient information of the green light signal Gin in the input image (chart), performing the absorption correction on the green light signal Gin using the interpolated blue light signal Bo, and then performing the interpolation on the red light signal Rin using the absorption-corrected green light signal Go. Further, the image shown on the left side of FIG. 13 is an image obtained by performing the interpolation on the blue light signal Bin and the red light signal Rin using the intensity gradient information of the green light signal Gin in the input image (chart), and then performing the absorption correction on the green light signal Gin using the interpolated blue light signal Bo.

As shown in FIG. 13, when the image in which the blue region and the red region are alternately arranged is input like the above-described chart, it may be seen that the second example embodiment is superior in the color reproducibility and color resolution as compared with the first example embodiment.

Third Example Embodiment

Figure 14:
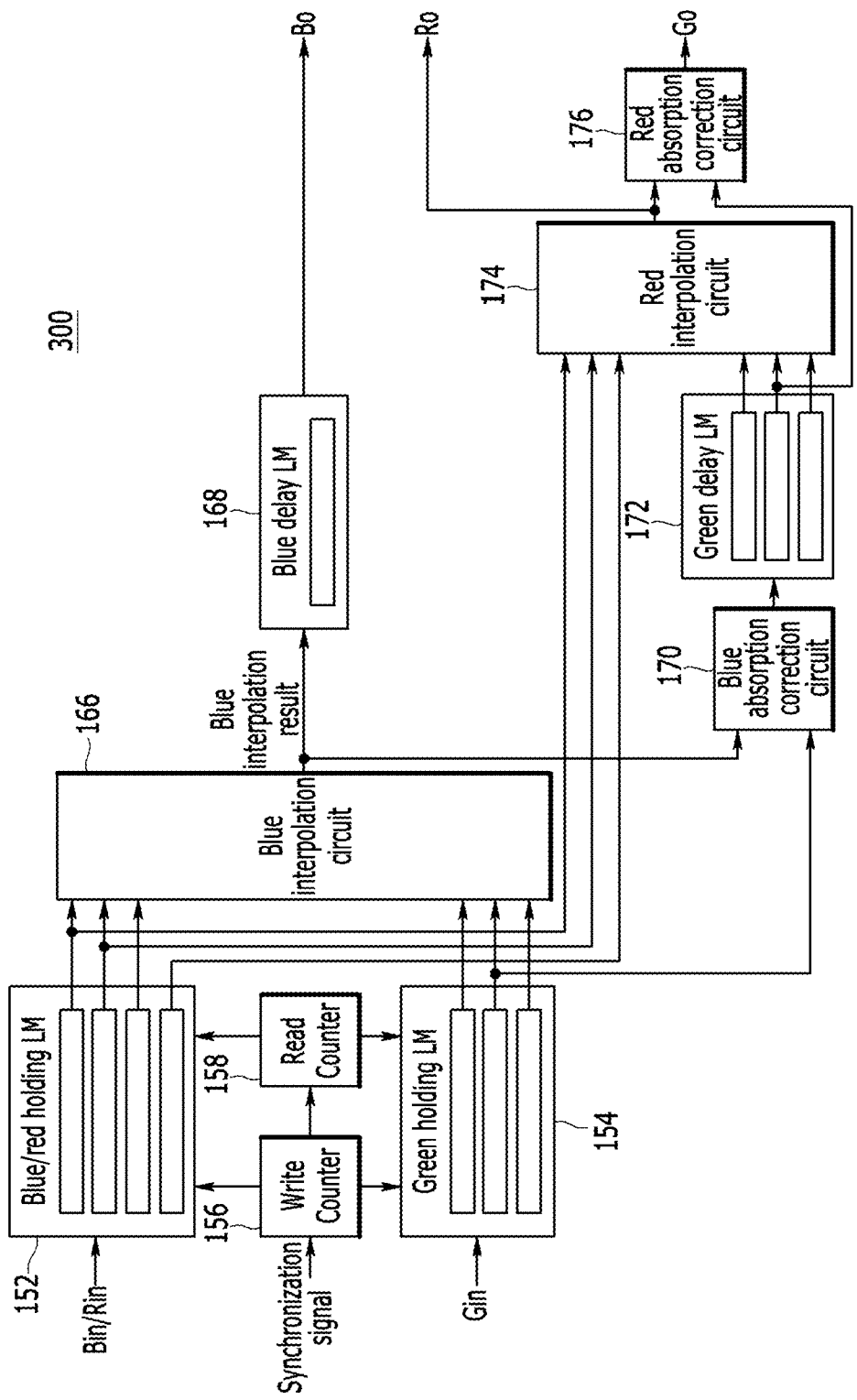
FIG. 14 is a diagram showing an example of a signal processing apparatus according to a third example embodiment.
Figure 15:
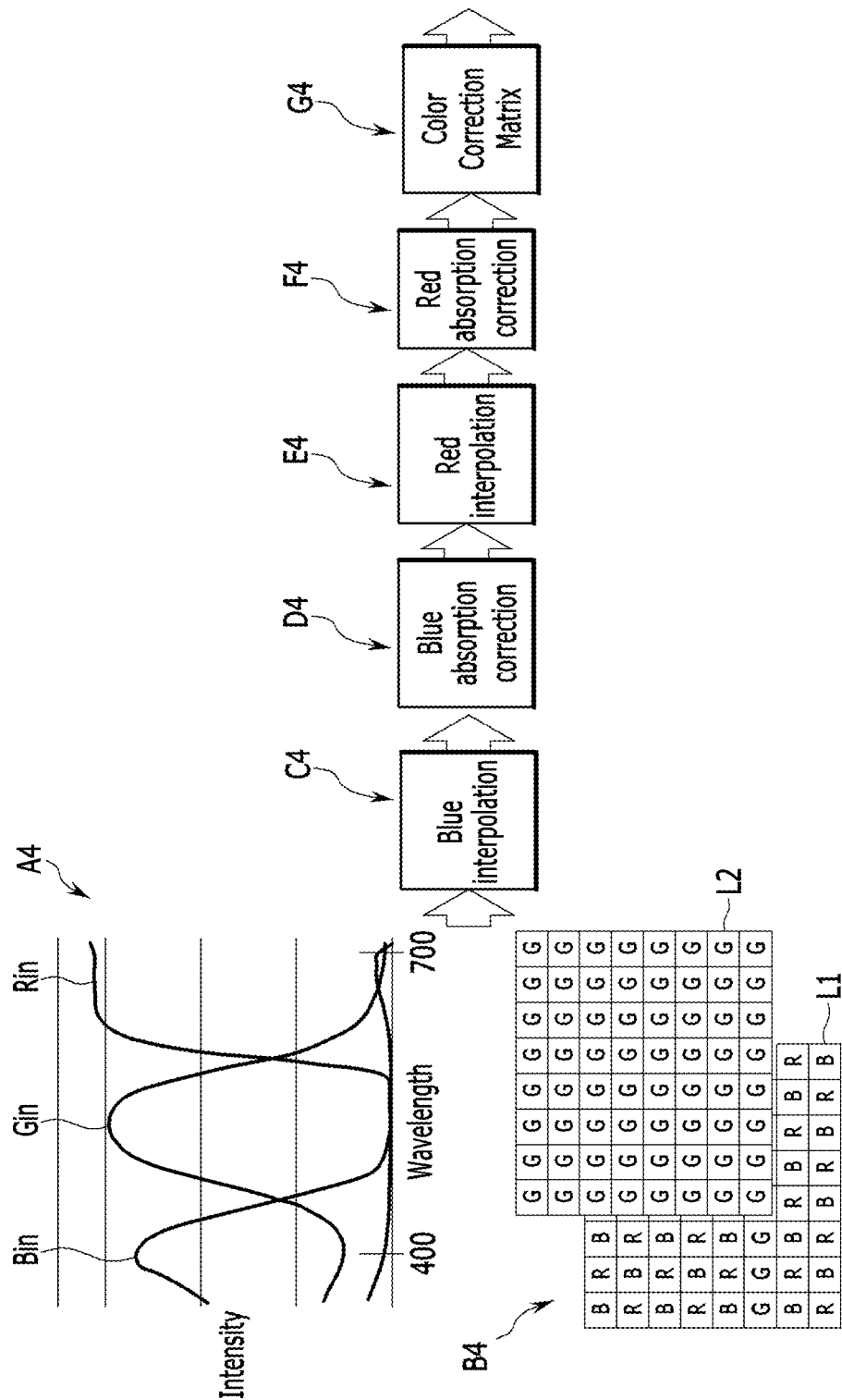
FIG. 15 is a diagram showing an example of a signal processing method according to a third example embodiment.
Figure 16:
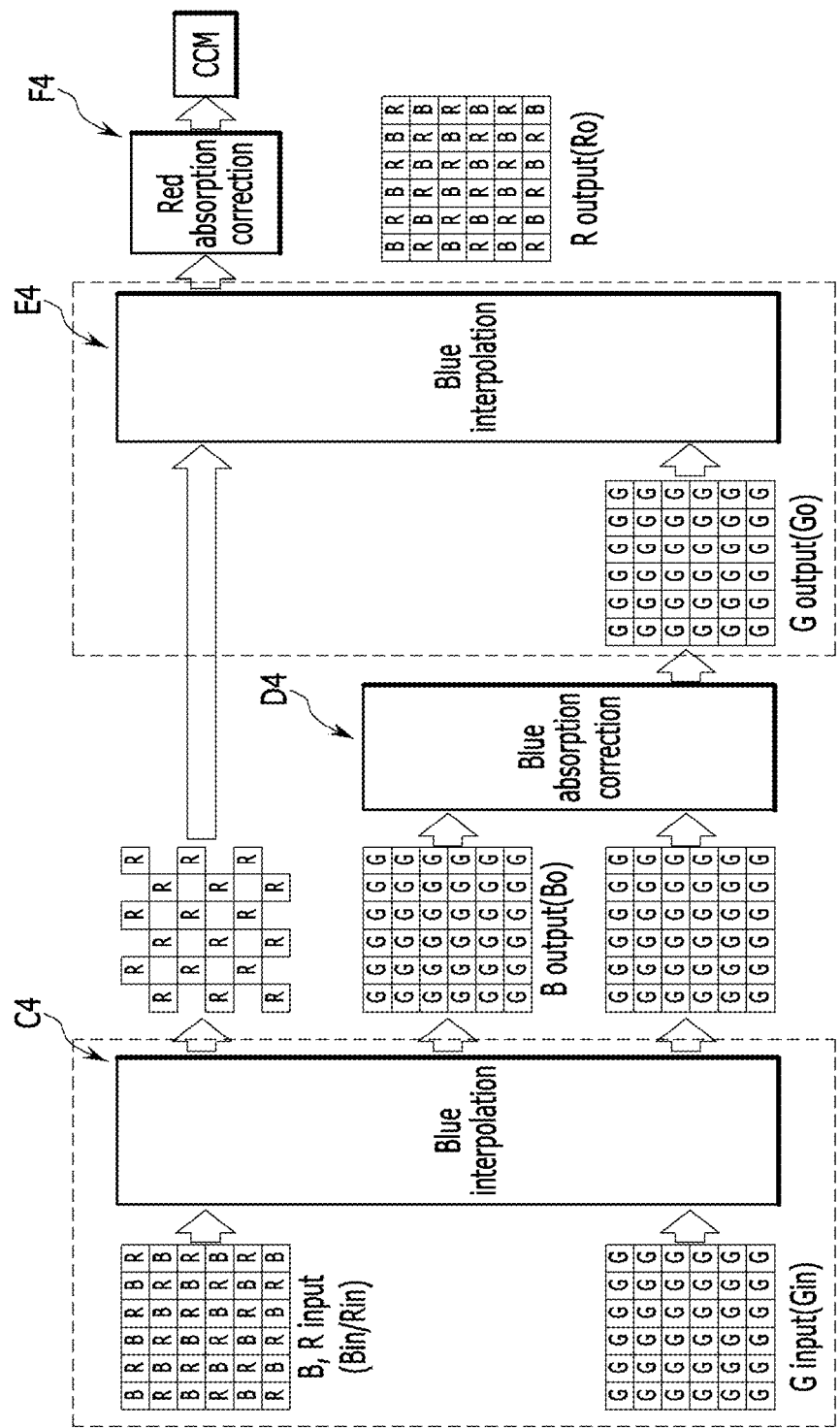
FIG. 16 is a diagram showing an interpolation process, an absorption correction process, an interpolation process, and an absorption correction process shown in FIG. 15.
Figure 17:
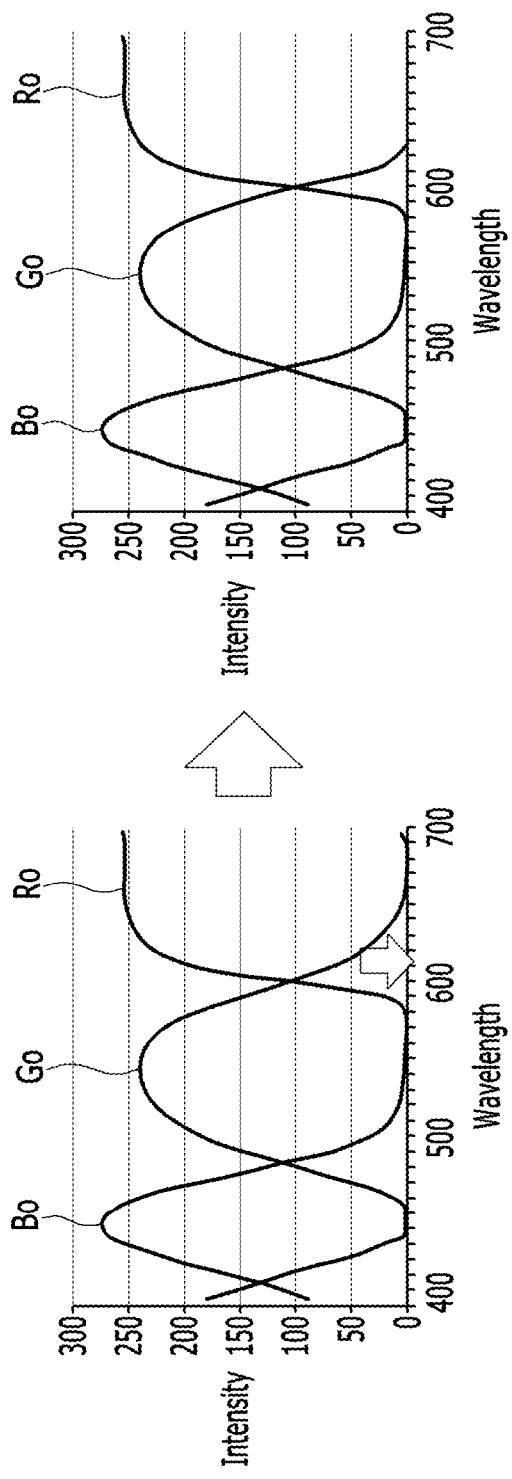
FIG. 17 is a diagram an example of a result of red absorption correction in a signal processing apparatus according to a third example embodiment.

Hereinafter, a third example embodiment is described with reference to FIG. 14 to FIG. 17. FIG. 14 is a diagram showing an example of a signal processing apparatus 300 according to a third example embodiment, and FIG. 15 is a diagram showing an example of a signal processing method according to a third example embodiment. FIG. 16 is a diagram showing an interpolation process, an absorption correction process, an interpolation process, and an absorption correction process shown in FIG. 15. FIG. 17 is a diagram an example of a result of red absorption correction in a signal processing apparatus according to a third example embodiment.

As shown in FIG. 14, the signal processing apparatus 300 according to the third example embodiment includes a red absorption correction circuit 176 serving as a second absorption correction unit (also referred to herein as a second absorption correction circuit) differently from the signal processing apparatus 200 according to the second example embodiment. Hereinafter, in the signal processing apparatus 300 according to the third example embodiment, the same elements as those of the signal processing apparatus 200 according to the second example embodiment are designated by the same reference numerals, and their descriptions are omitted.

In some example embodiments, the red absorption correction circuit 176 is configured to perform absorption correction on the absorption-corrected signal of the third light using the interpolated signal of the second light. For example, the red absorption correction circuit 176 may perform an absorption correction process on a green light signal Go based on the green light signal Go read from a green holding line memory 172 and an interpolated red light signal Ro. In some example embodiments, the red absorption correction circuit 176 may perform the absorption correction process on the interpolated red light signal Ro.

Then, in some example embodiments, a blue light signal Bo interpolated by a blue interpolation circuit 166 may be input to a color correction matrix circuit via a blue delay line memory 168, the green light signal Go on which the absorption correction process is performed by the red absorption correction circuit 176 may be input to the color correction matrix circuit, and the red light signal Ro interpolated by a red interpolation circuit 174 may be input to the color correction matrix circuit. The color correction matrix circuit performs a color correction process on the blue light signal Bo, the red light signal Ro, and the green light signal Go.

As shown in FIG. 15, the signal processing method according to the third example embodiment performs a red absorption correction F4 after performing a red interpolation process E4, differently from the signal processing method according to the second example embodiment. The processes C4, D4, and E4 up to the red interpolation process E4 in the third example embodiment are the same as those in the second example embodiment. Therefore, in the signal processing method according to third example embodiment, the descriptions of the same processes as those of the signal processing method according to the second example embodiment are omitted.

The signal processing method according to the third example embodiment includes the blue interpolation process C4 serving as a first interpolation step, the blue absorption correction process D4 serving as a first absorption correction step, the red interpolation process E4 serving as a second interpolation step, the red absorption correction process F4 serving as a second absorption correction step, and the color correction matrix process G4 serving as a color correction step.

The red absorption correction circuit 176 of the signal processing apparatus 300 performs the red absorption correction F4 on the green light signal Go on which the blue absorption correction is performed, using the red light signal Ro on which the red interpolation is performed. In some example embodiments, the red absorption correction may be performed by subtracting a value obtained by multiplying a value of the red signal Rin by $\alpha'/(1-\alpha')$ from the green light signal Go in the same manner as the blue absorption correction. Unlike the blue absorption correction, the correction value $\alpha'$ may be determined by calculating YSNR10 and a value of a color difference $\Delta E^*_{ab}$, not Gbottom' in Equation 13 or Gabs' in Equation 14. In some example embodiments, the correction value $\alpha'$ may be a value in which YSNR10 has the lowest value within a range where the value of the color difference $\Delta E^*_{ab}$ is not deteriorated.

Here, the YSNR10 means the illuminance [lux] at which a ratio of the green signal after the color correction matrix process is performed to noise that occurs when the image sensor (photoelectric conversion member) measures the signal is 10. Further, the smaller the YSNR10 value, the better the image characteristics at the low illuminance environment.

In some example embodiments, in the red absorption correction process F4, the absorption correction process may also be performed on the interpolated red light signal Ro.

In some example embodiments, the color correction matrix circuit of the signal processing apparatus 300 may perform the color correction matrix process (color correction process) G4 on the blue light signal Bo, the red light signal Ro, and the green light signal Go on which the red absorption correction is performed. The color correction process in the signal processing apparatus 300 according to the third example embodiment may be executed to allow the YSNR10 have the lowest value within a range where the value of the color difference $\Delta E^*_{ab}$ is not deteriorated, differently from the color correction process in the signal processing apparatuses 100 and 200 according to the first and second example embodiments.

Hereinafter, the absorption correction process F4 is described with reference to FIG. 16.

After the interpolation is performed on the red light signal Rin, the signal processing apparatus 300, as shown in FIG. 16, performs the absorption correction process D4 on the green light signal Go based on the green light signal Go on which the blue absorption correction is performed and the interpolated red light signal. Since the absorption correction process is performed on the green light signal Go, the green light signal with the high color reproducibility may be generated.

FIG. 17 shows a result of the red absorption correction performed in the signal processing apparatus 300 according to the third example embodiment. A left side of FIG. 17 shows intensity distributions of the red light signal Ro, the green light signal Go, and the blue light signal Bo after the blue interpolation process, the blue absorption correction process, and the red interpolation process are performed in the signal processing apparatus 300. Further, a the right side of FIG. 17 shows intensity distributions of the red light signal Ro, the green light signal Go after the red absorption correction process is further performed, and the blue light signal Bo in the signal processing apparatus 300. As shown in FIG. 17, the color purity of the red light signal Ro may be improved and the color reproducibility (YSNR10 value) in the dark part of the green light signal Go may be improved by further performing the red absorption correction process on the green light signal Go after the blue absorption correction process is performed. Specifically, a result of subtracting the red light signal Ro from the green light signal Go shown in the left graph of FIG. 17 is shown in the right graph of FIG. 17. As shown in the left graph of FIG. 17, it may be seen that the intensity of the green light signal Go becomes zero near the wavelength of 650 nm. In other words, when the red light signal Ro is subtracted from the green light signal Go, the intensity of the green light signal Go becomes zero or less, that is, the sensitivity of the green light signal Go becomes negative at the wavelength longer than 650 nm. In the normal absorption correction, the green light signal Go is not corrected so as to become negative. However, in the signal processing method according to the third example embodiment, the green light signal with the high color reproducibility may be generated by performing the absorption correction so that the sensitivity of the green light signal becomes negative at the wavelength longer than 650 nm.

Table 1 shows values of YSNR10 and color difference $\Delta E^*_{ab}$ in a case where no absorption correction is performed on the red light signal Rin, the green light signal Gin, and the blue light signal Bin measured by the two image sensors (photoelectric conversion members), a case where the blue interpolation process and the blue absorption correction process are performed by the signal processing apparatus 100 according to the first example embodiment, a case wherein the red interpolation process and the red absorption correction process are performed by the signal processing apparatus 100 according to the first example embodiment, and a case where the blue interpolation process, the blue absorption correction process, the red interpolation process, and the red absorption correction process are performed by the signal processing apparatus according to the third example embodiment

TABLE 1

| | Type of image sensor | | | |
|---|---|---|---|---|
| | D65 | | 3200K | |
| | YSNR10 [lux] | $\Delta E^*_{ab}$ | YSNR10 [lux] | $\Delta E^*_{ab}$ |
| No absorption correction | 94.02 | 3.22 | 88.68 | 4.8 |
| Only blue absorption correction | 91.40 | 3.22 | 87.64 | 4.8 |
| Only red absorption correction | 92.12 | 3.2 | 86.54 | 4.8 |
| Blue and red absorption correction | 89.50 | 3.2 | 85.40 | 4.8 |

As shown in Table 1, in the signal processing apparatus and the signal processing method according to the third example embodiment, YSNR10 may be sufficiently reduced within a range where the value of the color difference $\Delta E^*_{ab}$ is not deteriorated. That is, in the signal processing apparatus and the signal processing method according to the third example embodiment, it is possible to improve the color purity of the red light signal Ro and improve the color reproducibility of the green light signal Go in the dark part.

In the signal processing apparatus and the signal processing method according to the third example embodiment described above, the same effects as those of the signal processing apparatus 200 and the signal processing method according to the second example embodiment may be obtained. Further, the absorption correction process on the green light signal Gin may be performed by using the blue light signal Bo and by further using the interpolated red light signal Ro. As a result, the green light signal with the higher color reproducibility may be generated.

The signal processing apparatus according to some example embodiments may be applied to, for example, any device, which may process an image signal obtained by imaging in an image sensor having a plurality of photoelectric conversion layers, including a computer such as PC (personal computer) or a server, or a tablet type device. Further, the signal processing apparatus according to some example embodiments may be applied to, for example, an IC (integrated circuit) that may be embedded into the above-described device.

For example, in some example embodiments, the signal processing apparatus or some element of the signal processing apparatus may be implemented using processing circuitry such as hardware including logic circuits, a hardware/ software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC), etc. For example, the processing circuitry may be configured as a special purpose computer to interpolate the at least one of the signal of the first light (e.g., blue light signal Bin) or the signal of the second light (e.g., red light signal Rin) obtained by photoelectric conversion in the first photoelectric conversion layer L1, using the signal of the third light (e.g., green light signal Gin) obtained by photoelectric conversion in the second photoelectric conversion layer L2, and to perform absorption correction on the signal of the third light, using the interpolated at least one of signal of the first light or the signal of the second light. For example, the processing circuitry may be configured as a special purpose computer to the signal of the first light (e.g., blue light signal Bin) obtained by photoelectric conversion in the first photoelectric conversion layer L1, using the signal of the third light (e.g., green light signal Gin) obtained by photoelectric conversion in the second photoelectric conversion layer L2, to perform absorption correction on the signal of the third light, using the interpolated signal of the first light, and to interpolate the signal of the second light (e.g., red light signal Rin) obtained by photoelectric conversion in the first photoelectric conversion layer L1, using the absorption-corrected signal of the third light.

In addition, as described above, the signal processing apparatus according to some example embodiments includes an imaging unit including an image sensor having a first photoelectric conversion layer and a second photoelectric conversion layer (an example of a plurality of photoelectric conversion layers), and may function as an imaging apparatus. In this case, the imaging apparatus according to some example embodiments may be applied to, for example, any device having an imaging function, such as a digital still camera, a digital video camera, a smartphone, or a mobile phone.

While the inventive concepts have been described in connection with what is presently considered to be practical example embodiments, it is to be understood that the inventive concepts are not limited to the disclosed example embodiments. On the contrary, it is intended to cover various modifications and equivalent arrangements included within the spirit and scope of the appended claims.

What is claimed is:

1. A signal processing apparatus, comprising:
   a photoelectric conversion member including
      a first photoelectric conversion layer configured to photoelectrically convert a first light and a second light, the second light having a different wavelength from a wavelength of the first light, and
      a second photoelectric conversion layer on an incident light surface of the first photoelectric conversion layer, such that the first photoelectric conversion layer is configured to receive the first light and the second light through the second photoelectric conversion layer, the second photoelectric conversion layer configured to photoelectrically convert a third light, the third light having a different wavelength from the wavelength of the first light and the wavelength of the second light;
   an interpolation circuit configured to interpolate at least one of a signal of the first light or a signal of the second light obtained by photoelectric conversion in the first photoelectric conversion layer, using a signal of the third light obtained by photoelectric conversion in the second photoelectric conversion layer; and
   an absorption correction circuit configured to perform absorption correction on the signal of the third light, using the interpolated at least one of the signal of the first light or the signal of the second light,
   wherein the interpolation circuit is configured to interpolate the at least one of the signal of the first light or the signal of the second light using intensity gradient information of the signal of the third light obtained by photoelectric conversion in the second photoelectric conversion layer.

2. The signal processing apparatus of claim 1, wherein the absorption correction circuit is configured to perform the absorption correction on the signal of the third light by subtracting a value obtained by multiplying a value of the signal of the first light by $\alpha/(1-\alpha)$ from the signal of the third light, wherein $\alpha$ is a correction value determined in consideration of at least one of a component of the first light or a component of the second light absorbed by the second photoelectric conversion layer.

3. The signal processing apparatus of claim 1, wherein
   the first photoelectric conversion layer is configured to photoelectrically convert blue light as the first light and red light as the second light, and
   the second photoelectric conversion layer is configured to photoelectrically convert green light as the third light.

4. A signal processing apparatus comprising:
   a photoelectric conversion member including
      a first photoelectric conversion layer configured to photoelectrically convert a first light and a second light, the second light having a different wavelength from a wavelength of the first light, and
      a second photoelectric conversion layer on an incident light surface of the first photoelectric conversion layer such that the first photoelectric conversion layer is configured to receive the first light and the second light through the second photoelectric conversion layer, the second photoelectric conversion layer configured to photoelectrically convert a third light, the third light having a different wavelength from the wavelength of the first light and the wavelength of the second light;
   a first interpolation circuit that is configured to interpolate a signal of the first light obtained by photoelectric conversion in the first photoelectric conversion layer, using a signal of the third light obtained by photoelectric conversion in the second photoelectric conversion layer;
   a first absorption correction circuit that is configured to perform absorption correction on the signal of the third light to generate an absorption-corrected signal of the third light, using the interpolated signal of the first light; and
   a second interpolation circuit configured to interpolate a signal of the second light obtained by photoelectric conversion in the first photoelectric conversion layer, using the absorption-corrected signal of the third light.

5. The signal processing apparatus of claim 4, wherein the first interpolation circuit is configured to interpolate the signal of the first light obtained by photoelectric conversion in the first photoelectric conversion layer, using intensity gradient information of the signal of the third light obtained by photoelectric conversion in the second photoelectric conversion layer.

6. The signal processing apparatus of claim 4, wherein the second interpolation circuit is configured to interpolate the signal of the second light obtained by photoelectric conversion in the first photoelectric conversion layer, using intensity gradient information of the absorption-corrected signal of the third light.

7. The signal processing apparatus of claim 4, wherein the first absorption correction circuit is configured to perform the absorption correction on the signal of the third light by subtracting a value obtained by multiplying a value of the signal of the first light by $\alpha/(1-\alpha)$ from the signal of the third light, wherein $\alpha$ is a correction value determined in consideration of a component of the first light absorbed by the second photoelectric conversion layer.

8. The signal processing apparatus of claim 4, further comprising a second absorption correction circuit configured to perform absorption correction on the absorption-corrected signal of the third light using the interpolated signal of the second light.

9. The signal processing apparatus of claim 4, wherein
the first photoelectric conversion layer is configured to photoelectrically convert blue light as the first light and red light as the second light, and
the second photoelectric conversion layer is configured to photoelectrically convert green light as the third light.

10. A method of processing a signal generated by a photoelectric conversion member, the photoelectric conversion member including a first photoelectric conversion layer configured to photoelectrically convert a first light and a second light, the second light having a different wavelength from a wavelength of the first light, the photoelectric conversion member further including a second photoelectric conversion layer on an incident light surface of the first photoelectric conversion layer such that the first photoelectric conversion layer is configured to receive the first light and the second light through the second photoelectric conversion layer, the second photoelectric conversion layer configured to photoelectrically convert a third light having a different wavelength from the wavelength of the first light and the wavelength of the second light, the method comprising:
interpolating at least one of a signal of the first light or a signal of the second light obtained by photoelectric conversion in the first photoelectric conversion layer, based on a signal of third light obtained by photoelectric conversion in the second photoelectric conversion layer; and
performing absorption correction on the signal of the third light, using the interpolated at least one of the signal of the first light or the signal of the second light,
wherein the interpolating includes interpolating the at least one of the signal of the first light or the signal of the second light, using intensity gradient information of the signal of the third light obtained by photoelectric conversion in the second photoelectric conversion layer.

11. The method of claim 10, wherein the performing the absorption correction is based on subtracting a value obtained by multiplying a value of the signal of the first light by $\alpha/(1-\alpha)$ from the signal of the third light, wherein $\alpha$ is a correction value determined in consideration of at least one of a component of the first light or a component of the second light absorbed by the second photoelectric conversion layer.

12. The method of claim 10, wherein
the first photoelectric conversion layer is configured to photoelectrically convert blue light as the first light and red light as the second light, and
the second photoelectric conversion layer is configured to photoelectrically convert green light as the third light.

13. A method of processing a signal generated by a photoelectric conversion member, the photoelectric conversion member including a first photoelectric conversion layer configured to photoelectrically convert a first light and a second light, the second light having a different wavelength from a wavelength of the first light, the photoelectric conversion member further including a second photoelectric conversion layer on an incident light surface of the first photoelectric conversion layer such that the first photoelectric conversion layer is configured to receive the first light and the second light through the second photoelectric conversion layer, the second photoelectric conversion layer configured to photoelectrically convert a third light having a different wavelength from the wavelength of the first light and the wavelength of the second light, the method comprising:
interpolating a signal of the first light obtained by photoelectric conversion in the first photoelectric conversion layer, using a signal of the third light obtained by photoelectric conversion in the second photoelectric conversion layer;
performing absorption correction on the signal of the third light to generate an absorption-corrected signal of the third light, using the interpolated signal of the first light; and
interpolating a signal of the second light obtained by photoelectric conversion in the first photoelectric conversion layer, using absorption-corrected the signal of the third light.

14. The method of claim 13, wherein the interpolating the signal of the first light includes interpolating the signal of the first light obtained by photoelectric conversion in the first photoelectric conversion layer, using intensity gradient information of the signal of the third light obtained by photoelectric conversion in the second photoelectric conversion layer.

15. The method of claim 13, wherein the interpolating the signal of the second light includes interpolating the signal of the second light obtained by photoelectric conversion in the first photoelectric conversion layer, using intensity gradient information of the absorption-corrected signal of the third light.

16. The method of claim 13, wherein performing the absorption correction includes performing the absorption correction on the signal of the third light by subtracting a value obtained by multiplying a value of the signal of the first light by $\alpha/(1-\alpha)$ from the signal of the third light, wherein $\alpha$ is a correction value determined in consideration of a component of the first light absorbed by the second photoelectric conversion layer.

17. The method of claim 13, further comprising:
performing absorption correction on the absorption-corrected signal of the third light using the interpolated signal of the second light.

18. The method of claim 13, wherein
the first photoelectric conversion layer is configured to photoelectrically convert blue light as the first light and red light as the second light, and the second photoelectric conversion layer is configured to photoelectrically convert green light as the third light.

* * * * *